(12) United States Patent
Jiang et al.

(10) Patent No.: US 12,295,270 B2
(45) Date of Patent: May 6, 2025

(54) RRAM DEVICE WITH IMPROVED PERFORMANCE

(71) Applicant: Taiwan Semiconductor Manufacturing Company, Ltd., Hsin-Chu (TW)

(72) Inventors: Fa-Shen Jiang, Taoyuan (TW); Cheng-Yuan Tsai, Chu-Pei (TW); Hai-Dang Trinh, Hsinchu (TW); Hsing-Lien Lin, Hsin-Chu (TW); Bi-Shen Lee, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 733 days.

(21) Appl. No.: 17/511,858

(22) Filed: Oct. 27, 2021

(65) Prior Publication Data

US 2022/0052260 A1 Feb. 17, 2022

Related U.S. Application Data

(63) Continuation of application No. 16/601,771, filed on Oct. 15, 2019, now Pat. No. 11,165,021.

(51) Int. Cl.
*H10N 70/00* (2023.01)
*H10B 63/00* (2023.01)

(52) U.S. Cl.
CPC .......... *H10N 70/041* (2023.02); *H10B 63/00* (2023.02); *H10N 70/023* (2023.02); *H10N 70/841* (2023.02); *H10N 70/8836* (2023.02)

(58) Field of Classification Search
CPC ...... H10B 63/00; H10B 63/30; H10N 70/011; H10N 70/023; H10N 70/041;
(Continued)

(56) References Cited

U.S. PATENT DOCUMENTS 9,246,085 B1   1/2016 Wang
2007/0045605 A1* 3/2007 Hsueh ............... H10B 63/20
257/E29.17
(Continued)

FOREIGN PATENT DOCUMENTS

KR   20170023350 A   3/2017

OTHER PUBLICATIONS

Johnson et al. "A Brief Review of Atomic Layer Deposition: From Fundamentals to Applications." Materials Today, vol. 17, No. 5, Jun. 2014.
(Continued)

*Primary Examiner* — Michelle Mandala
*Assistant Examiner* — Kevin Quinto
(74) *Attorney, Agent, or Firm* — Eschweiler & Potashnik, LLC

(57) ABSTRACT

The present disclosure relates to a resistive random access memory (RRAM) device. In some embodiments, the RRAM device includes a first electrode disposed over a substrate and a second electrode over the first electrode. A doped data storage structure is disposed between the first electrode and the second electrode. The doped data storage structure has a dopant with a doping concentration profile that is asymmetric over a height of the doped data storage structure and that has a maximum dopant concentration at non-zero distances from a top surface and a bottom surface of the doped data storage structure.

20 Claims, 14 Drawing Sheets

(58) Field of Classification Search
CPC .... H10N 70/063; H10N 70/24; H10N 70/826; H10N 70/841; H10N 70/881; H10N 70/8833; H10N 70/8836
See application file for complete search history.

(56) References Cited

U.S. PATENT DOCUMENTS

| | | | |
|---|---|---|---|
| 2009/0237983 A1* | 9/2009 | Happ | H10N 70/231 |
| | | | 257/E47.001 |
| 2011/0227024 A1* | 9/2011 | Sekar | H10N 70/841 |
| | | | 257/4 |
| 2013/0112914 A1* | 5/2013 | Han | H10N 70/8828 |
| | | | 252/79.1 |
| 2016/0049584 A1 | 2/2016 | Dang et al. | |
| 2018/0047900 A1* | 2/2018 | Reid | H10N 70/841 |
| 2018/0090207 A1 | 3/2018 | Hou et al. | |

OTHER PUBLICATIONS

H.C.M. Knoops, S.E. Potts, A.A. Bol, and W.M.M. Kessels, Ch. 27—Atomic Layer Deposition (pp. 1101-1134) in Handbook of Crystal Growth, edited by T. Kuech (Elsevier, 2015). doi: 10.1016/B978-0-444-63304-0.00027-5. Published in 2015.
Non-Final Office Action dated Oct. 2, 2020 for U.S. Appl. No. 16/601,771.
Final Office Action dated Apr. 5, 2021 for U.S. Appl. No. 16/601,771.
Notice of Allowance dated Jul. 2, 2021 for U.S. Appl. No. 16/601,771.

\* cited by examiner

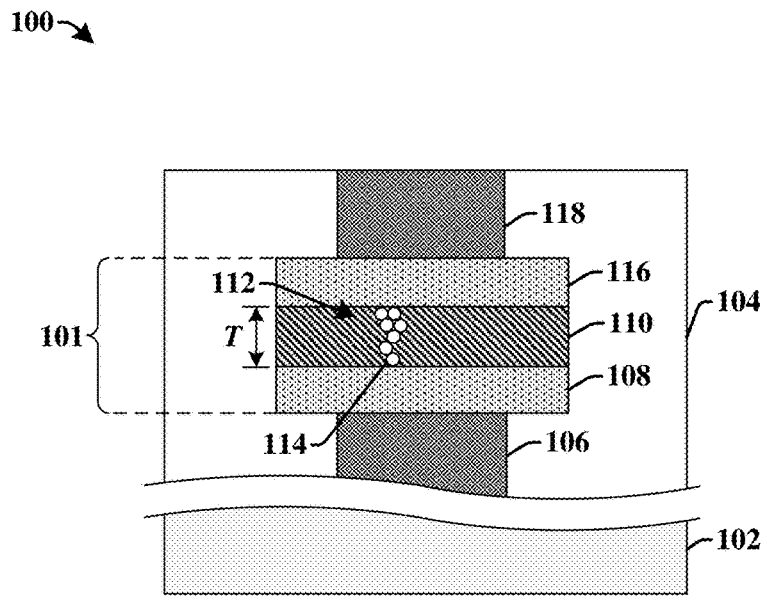
Fig. 1A
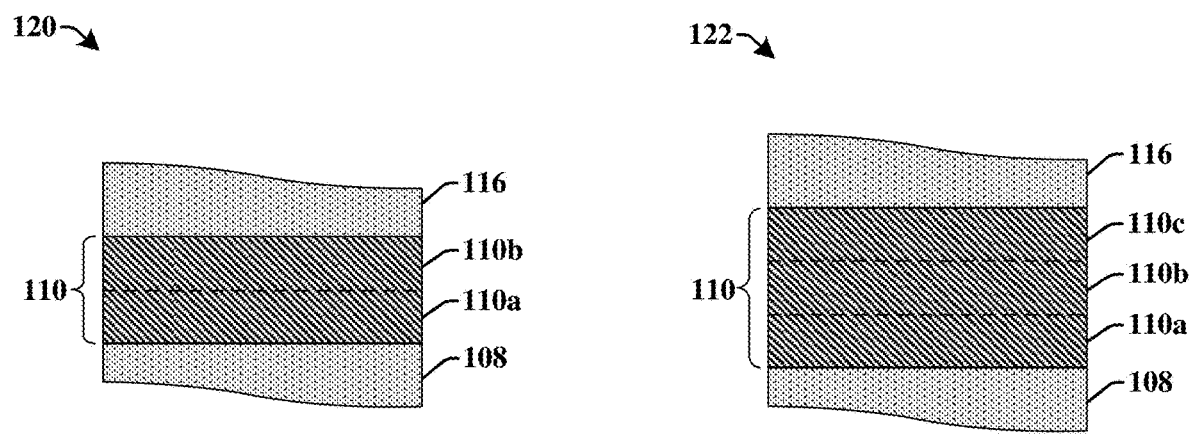
Fig. 1B
Fig. 1C

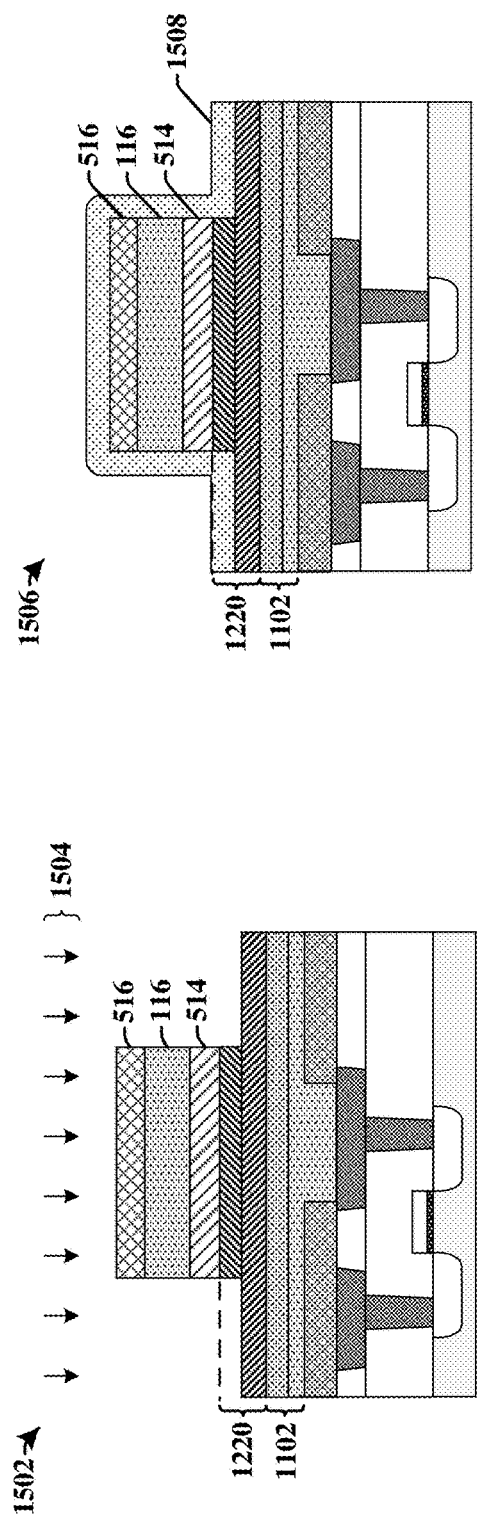
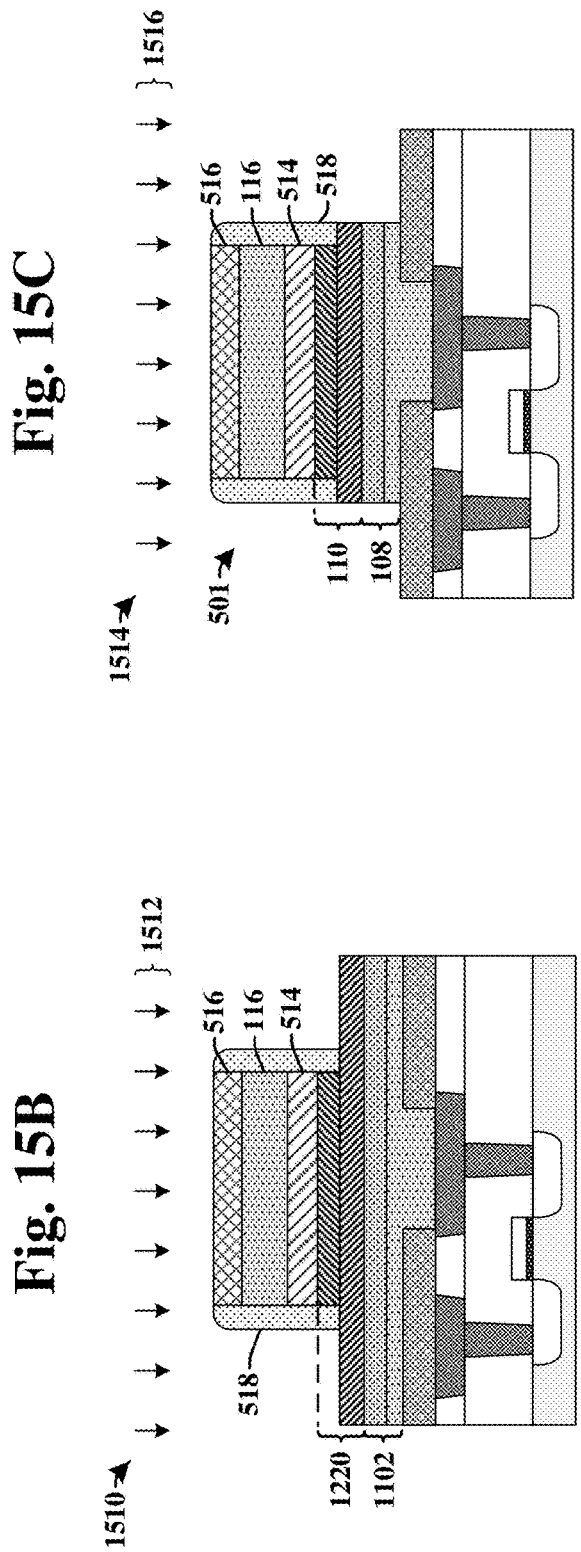
Fig. 15B
Fig. 15C
Fig. 15D
Fig. 15E

RRAM DEVICE WITH IMPROVED PERFORMANCE

REFERENCE TO RELATED APPLICATION

This Application is a Continuation of U.S. application Ser. No. 16/601,771, filed on Oct. 15, 2019, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random access memory (RRAM) is one promising candidate for next generation non-volatile memory technology due to its simple structure and its compatibility with CMOS logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a cross-sectional view of some embodiments of a resistive random access memory (RRAM) device having a doped data storage structure configured to provide the RRAM device with a good reliability.

FIGS. 1B-1C illustrate cross-sectional views of some embodiments of doped data storage structures having a plurality of data storage layers with different doping concentrations.

DETAILED DESCRIPTION

Figure 2:
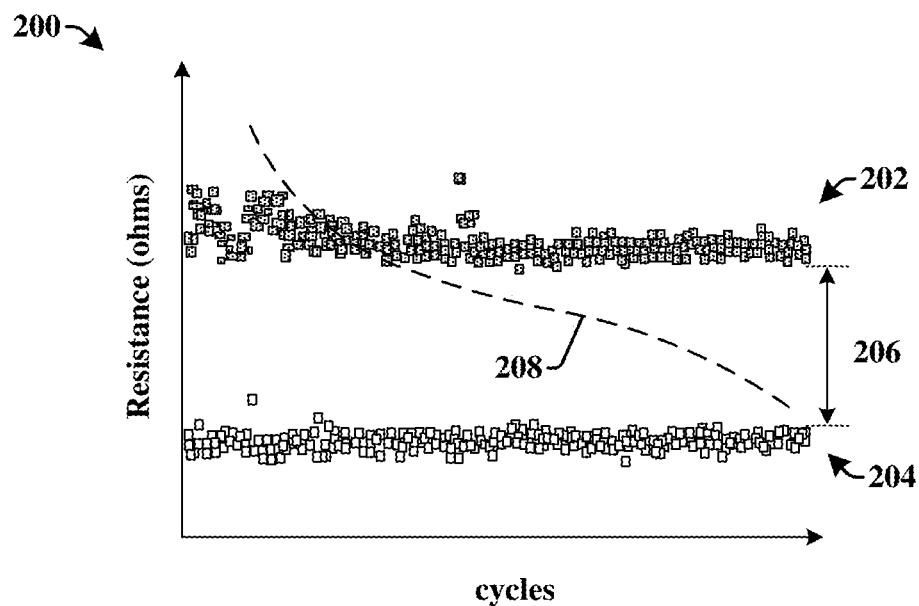
FIG. 2 illustrates a graph of some embodiments showing resistances of high and low resistive states for an RRAM device having a doped data storage structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices are configured to store data by switching between a high resistive state corresponding to a first data state (e.g., a "0") and a low resistive state corresponding to a second data state (e.g., a "1"). To enable such 'resistive switching,' RRAM devices have a lower electrode that is separated from an upper electrode by a data storage structure having a variable resistance. The data storage structure typically comprises a high-k dielectric material (e.g., hafnium-oxide) that is able to alter its internal resistance in response to applied biases.

For example, the resistance of a data storage structure is typically determined by the presence of a conductive filament comprising a plurality of oxygen vacancies within the data storage structure. If a conductive filament is present, the data storage structure has a relatively low resistance associated with a low resistive state. If a conductive filament is not present, the data storage structure has a relatively high resistance associated with a high resistive state. To change between the low resistive state and the high resistive state, an applied bias may move oxygen vacancies into or out of a data storage structure to form a conductive filament extending through the data storage structure or to break a conductive filament that was extending through the data storage structure.

It has been appreciated that over time (e.g., over a large number of read and/or write cycles) currents passing through a data storage structure may break oxygen-oxygen bonds within the data storage structure, thereby increasing a number of oxygen vacancies that are present within the data storage structure. While oxygen vacancies that are close to the upper electrode can be easily moved in and out of the data storage structure during operation, oxygen vacancies that are further from the upper electrode may be more difficult to remove resulting in excess oxygen vacancies within the data storage structure. The excess oxygen vacancies will cause the conductive filament to get thicker (e.g., along a bottom half of the data storage structure) when an RRAM device is in a low resistive state. The thicker filament degrades an RRAM device's reset efficiency by making it more difficult to switch from the low resistive state to the high resistive state. Over time, this degradation may reduce a read window (e.g., a difference between signals output from an RRAM device in the low resistive state and the high resistive state) and lead to device failure.

The present disclosure, in some embodiments, relates to an RRAM device having a doped data storage structure configured to mitigate degradation of a read window over time. The doped data storage structure is doped with one or more dopants that have a high bonding energy with oxygen. The high bonding energy (e.g., greater than approximately 500 KJ/mol) of the one or more dopants prevents bonds within the doped data storage structure from breaking and thereby reduces the number of oxygen vacancies within the doped data storage structure. By reducing the number of oxygen vacancies within the doped data storage structure, increases in a thickness of the conductive filament are mitigated over a large number of read and/or write cycles, thereby maintaining a good reset efficiency that provides for a stable read window and good data retention.

FIG. 1A illustrates a cross-sectional view of some embodiments of an integrated chip 100 comprising a resistive random access memory (RRAM) device having a doped data storage structure configured to provide the RRAM device with a good reliability.

The integrated chip 100 comprises an RRAM device 101 surrounded by an inter-level dielectric (ILD) structure 104 disposed over a substrate 102. The RRAM device 101 comprises a doped data storage structure 110 arranged between a lower electrode 108 and an upper electrode 116. The lower electrode 108 is separated from the substrate 102 by one or more lower interconnect layers 106 (e.g., a metal via and/or a metal wire). The upper electrode 116 is disposed between the doped data storage structure 110 and an upper interconnect layer 118 (e.g., a metal via and/or a metal wire).

The doped data storage structure 110 is configured to store different data states by undergoing a reversible change between a high resistive state associated with a first data state (e.g., a '0') and a low resistive state associated with a second data state (e.g., a '1'). For example, to achieve a low resistive state within the doped data storage structure 110, a first set of bias conditions may be applied to the lower electrode 108 and the upper electrode 116. The first set of bias conditions may drive oxygen from the doped data storage structure 110 to the upper electrode 116, thereby forming a conductive filament 112 of oxygen vacancies 114 across the doped data storage structure 110. Alternatively, to achieve a high resistive state within the doped data storage structure 110, a second set of bias conditions may be applied to the lower electrode 108 and the upper electrode 116. The second set of bias conditions may break the conductive filament 112 by driving oxygen from the upper electrode 116 to the doped data storage structure 110.

The doped data storage structure 110 is doped with one or more dopants that are configured to form bonds with oxygen that have a bond energy greater than that of oxygen-oxygen bonds (e.g., approximately 498 kJ/mol). For example, in some embodiments, the dopants may bond with oxygen with a bond energy of greater than approximately 500 kJ/mol. In other embodiments, the dopants may bond with oxygen with a bond energy of greater than approximately 600 kJ/mol. In various embodiments, the doped data storage structure 110 may comprise hafnium oxide, zirconium oxide, aluminum oxide, tantalum oxide, hafnium aluminum oxide, hafnium zirconium oxide, or the like. In various embodiments, the dopants may comprise nitrogen, fluorine, carbon, phosphorous, or the like. In some embodiments, the dopants may result in the doped data storage structure 110 comprising a metal oxynitride (e.g., hafnium oxynitride, tantalum oxynitride, etc.), a metal oxyflouride (e.g., hafnium oxyflouride, zirconium, oxyflouride, etc.), a metal oxycarbide (e.g., hafnium oxycarbide, aluminum oxycarbide, etc.), a metal oxyphosphide (e.g., hafnium oxyphosphide, zirconium oxyphosphide, etc.), or the like. In some such embodiments, a dopant comprising carbon may form a carbon-oxygen bond having a bond energy of approximately 1076 KJ/mol and/or a dopant comprising nitrogen may form a nitrogen-oxygen bond having a bond energy of approximately 630 KJ/mol. The bond energy between the dopants and oxygen molecules tightly binds oxygen molecules to the dopants within the doped data storage structure 110, thereby preventing bonds within the doped data storage structure 110 from breaking and mitigating an increase in the number of oxygen vacancies within the doped data storage structure 110 over time.

In some embodiments, the dopant has a non-uniform doping profile that changes over a thickness T of the doped data storage structure 110 (i.e., that is non-uniform along a height of the doped data storage structure 110). For example, in some embodiment the non-uniform doping profile may have a peak doping concentration that occurs at a position that is separated from the lower electrode 108 and the upper electrode 116 by non-zero distances. Because the dopants have a bond energy that is greater than that of oxygen-oxygen bonds, the non-uniform doping profile of the dopants can be used to control a number of oxygen vacancies that are present at different locations within the doped data storage structure 110. For example, in some embodiments the non-uniform doping profile may have a higher dopant concentration along a lower half of the doped data storage structure 110 than along an upper half. In such embodiments, the doping profile provides for sufficient oxygen vacancies within the upper half to form a conductive filament, while limiting a number of oxygen vacancies along the lower half of the doped data storage structure 110 (and mitigating increases in a width of the conductive filament 112). Controlling a number of oxygen vacancies that are present at different locations within the doped data storage structure 110 enables the RRAM device to maintain a low resistive state and a good read window between high resistive states and low resistive states.

FIGS. 1B-1C illustrate cross-sectional views, 120 and 122, of some embodiments of a doped data storage structure 110 comprising a plurality of data storage layers having different doping concentrations of a dopant that bonds with oxygen with a bond energy of greater than approximately 500 kJ/m. Although, FIGS. 1B-1C illustrate embodiments of doped data storage structures having two and three data storage layers, it will be appreciated that the disclosed doped data storage structure (e.g., doped data storage structure 110 of FIG. 1A) is not limited to such embodiments. Rather, the disclosed doped data storage structure may have any number of data storage layers.

As shown in cross-sectional view 120 of FIG. 1B, in some embodiments, the plurality of data storage layers 110a-110b may comprise a first data storage layer 110a having a first doping concentration and a second data storage layer 110b having a second doping concentration. In some embodiments, the first doping concentration may be larger than the second doping concentration. In some embodiments, the first doping concentration may be non-zero doping concentrations while the second doping concentration may be substantially zero. In some embodiments, the first and second doping concentrations may be discrete (e.g., discontinuous) at an interface between the first data storage layer 110a and the second data storage layer 110b. For example, in some embodiments, the first data storage layer 110a may have a first doping concentration of between approximately 7% and approximately 8%, while the second data storage layer 110b may contact the first data storage layer 110a and have a second doping concentration of between approximately 2% and approximately 3%. In other embodiments the first and second doping concentrations may be continuous over the interface.

As shown in cross-sectional view 122 of FIG. 1C, in some embodiments, the plurality of data storage layers 110a-110c may comprise a first data storage layer 110a having a first doping concentration, a second data storage layer 110b having a second doping concentration, and a third data storage layer 110c having a third doping concentration. In some embodiments, the first doping concentration may be smaller than the second doping concentration and the second doping concentration may be larger than the third doping concentration. In other embodiments, the first doping concentration may be larger than the second doping concentration and the second doping concentration may be larger than the third doping concentration. In some embodiments, the first doping concentration and the second doping concentration may be non-zero doping concentrations while the third doping concentration may be substantially zero. In some embodiments, the first, second, and third doping concentrations may be discrete (e.g., discontinuous) at an interface between adjacent data storage layers, while in other embodiments the first, second, and third doping concentrations may be continuous over the interface.

FIG. 2 illustrates a graph 200 of some embodiments of a resistance values of a disclosed RRAM device (e.g., RRAM device 101 of FIG. 1) in a low resistive state and in a high resistive state. The graph 200 illustrates a resistance of the RRAM device along the y-axis and a number of read and/or write cycles along the x-axis.

As shown in graph 200, resistances of high resistive states 202 are greater than resistances of low resistive states 204. During a read operation, signals applied to the RRAM device cause a signal (e.g., current) to be output having a value that depends on a resistance of the RRAM device. For example, an RRAM device in a low resistive state (e.g., indicating a first data state "1") will result in an output signal having a different value than an RRAM device in a high resistive state (e.g., indicating a second data state "0"). A read window is a difference between signals (e.g., currents) read out from RRAM device in a high resistive state and in a low resistive state. During operation of an RRAM device (e.g., RRAM device 101 of FIG. 1), it is desirable to maintain a relatively large read window (e.g., defined by a difference 206 between resistances of high resistive states 202 and the low resistive states 204 that is between 3-4 orders of magnitude), since a larger read window makes it easier to differentiate between different data states during a read operation.

If a concentration of the dopants within the doped data storage structure 110 is too low (e.g., less than approximately 1%) the difference 206 between resistances of high resistive states 202 and the low resistive states 204 will shrink (denoted by line 208) over time and eventually become too small to provide for a sufficiently large read window to accurately distinguish between different data states. However, if a concentration of the dopants within the doped data storage structure 110 is between approximately 1% and approximately 20%, the difference 206 between resistances of high resistive states 202 and the low resistive states 204 of an RRAM device remains substantially constant (e.g., between approximately $10^3$-$10^5$ ohms) as a number of read and/or write cycles increases (e.g., to over 10,000 cycles), so that the RRAM device maintains a sufficiently large read window to reliably operate.

Figure 3A:
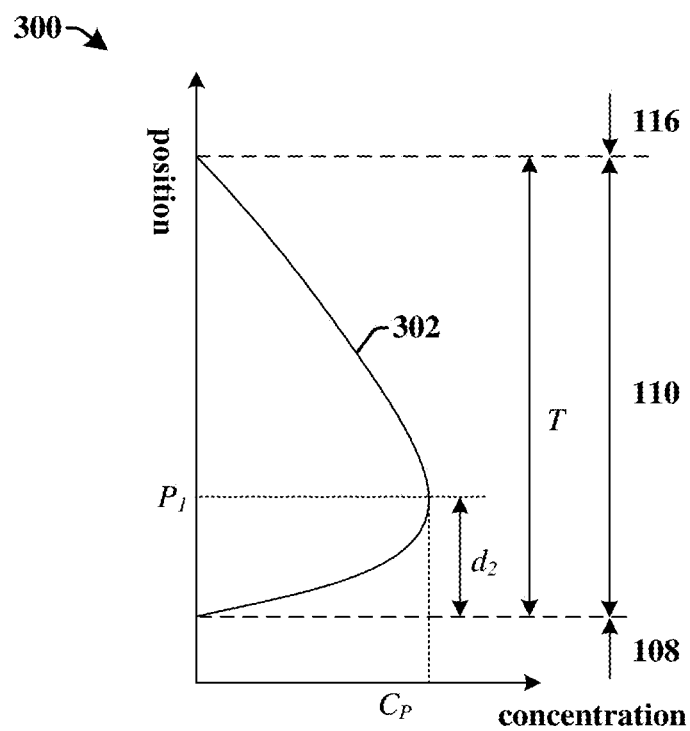
FIGS. 3A-3B illustrate graphs showing some embodiments of exemplary doping concentrations within a doped data storage structure of a disclosed RRAM device.
Figure 3B:
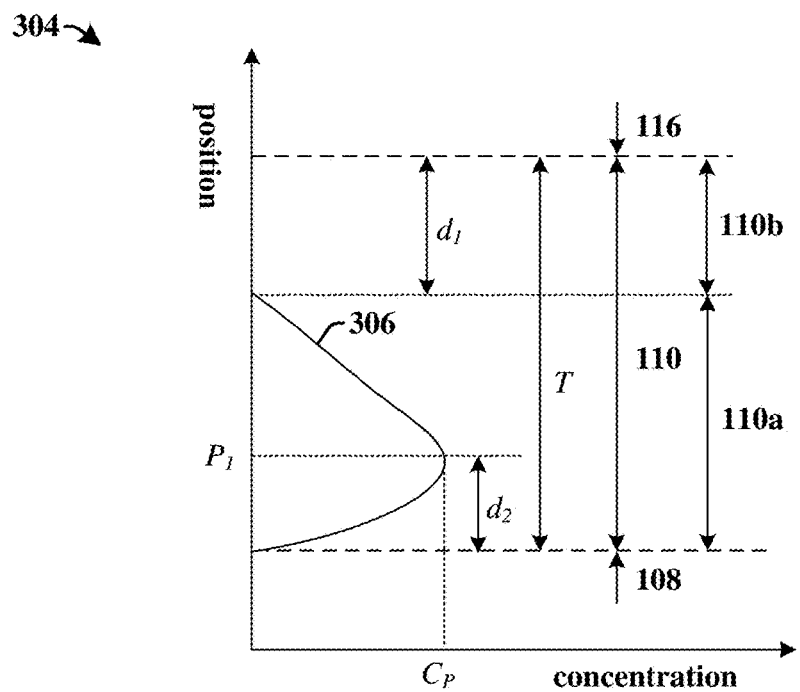

In various embodiments, the doping profile of the dopants within the doped data storage structure may have different profiles. FIGS. 3A-3B illustrate graphs, 300 and 304, showing some exemplary doping profiles of a doped data storage structure within a disclosed RRAM device. The graphs, 300 and 304, illustrate a position within the doped data storage structure 110 of the RRAM device along the y-axis, and a concentration of dopants within the doped data storage structure 110 along the x-axis. In various embodiments, the concentration of dopants within the doped data storage structure 110 may be a percent of oxygen ions that have been replaced with dopant ions, a percent weight of the dopants, a molar (atomic) percentage of the dopants, or the like.

As shown in graph 300 of FIG. 3A and graph 304 of FIG. 3B, the doped data storage structure 110 has a thickness T. In some embodiments, the thickness T may be in a range of between approximately 1 nm and approximately 20 nm. In other embodiments, the thickness T may be in a range of between approximately 2 nm and approximately 20 nm. In yet other embodiments, the thickness T may be in a range of between approximately 5 nm and approximately 10 nm.

In some embodiments, shown in graph 300 of FIG. 3A, the doping profile 302 has a non-zero doping concentration that continuously extends over the thickness T. In such embodiments, the doping profile 302 has a non-zero doping concentration that continuously extends between a top surface and a bottom surface of the doped data storage structure 110. The non-zero doping concentration results from a dopant (e.g., nitrogen, fluoride, carbon, phosphorous, or the like) being introduced into a metal oxide (e.g., hafnium oxide, tantalum oxide, zirconium oxide, aluminum oxide, hafnium aluminum oxide, hafnium zirconium oxide, or the like) to form a doped data storage structure 110 having a metal oxynitride, a metal oxyflouride, a metal oxyphosphide, or the like.

In some such embodiments, the doped data storage structure 110 may comprise a same material, which has a gradient doping concentration that continuously extends between the top and bottom surfaces of the doped data storage structure 110. For example, in some embodiments the doped data storage structure 110 may comprise hafnium oxynitride, tantalum oxynitride, hafnium oxyflouride, hafnium oxycarbide, hafnium oxyphosphide, or the like. In other embodiments (not shown), the doped data storage structure 110 may comprise different materials, which are stacked onto one another to extend between the top and bottom surfaces of the doped data storage structure 110. The different materials collectively have a gradient doping concentration that continuously extends between the top and bottom surfaces of the doped data storage structure 110. For example, the doped data storage structure may comprise a first doped data storage layer that is a first material (e.g., hafnium oxynitride) with a first doping concentration and an overlying second doped data storage layer that is a second material (e.g., tantalum oxynitride) with a second doping concentration.

In other embodiments, shown in graph 304 of FIG. 3B, the doping profile 306 has a non-zero doping concentration that extends over a distance that is less than the thickness T. For example, the doped data storage structure 110 may have a non-zero doping concentration that is separated from a top of the doped data storage structure 110 by a substantially zero doping concentration over a non-zero distance $d_1$. In some such embodiments, the doped data storage structure 110 may comprise layers having different materials. For example, the doped data storage structure 110 may comprise a first data storage layer 110a comprising a first material (e.g., hafnium oxynitride, tantalum oxynitride, zirconium oxynitride, aluminum oxynitride, hafnium aluminum oxynitride, hafnium zirconium oxynitride, or the like) and a second data storage layer 110b comprising a second material (e.g., hafnium oxide, tantalum oxide, zirconium oxide, aluminum oxide, hafnium aluminum oxide, hafnium zirconium oxide, or the like).

As shown in graph 300 of FIG. 3A and graph 304 of FIG. 3B, the doping profile 302 of the dopants within the doped data storage structure 110 has a peak dopant concentration $C_P$ at a position $P_1$ that is vertically separated from the lower electrode 108 by a second non-zero distance $d_2$. In some embodiments, the second non-zero distance $d_2$ is in a range of between approximately 5% and approximately 40% of the thickness T. For example, in some embodiments, the position $P_1$ be between approximately 1 angstroms and approximately 80 angstroms over a bottom of the doped data storage structure 110. While oxygen vacancies close to the upper electrode 116 can be easily moved out of the doped data storage structure 110, oxygen vacancies that are further from the upper electrode 116 may be more difficult to remove resulting in excess oxygen vacancies within the data storage structure. Having the peak doping concentration at a position that is between approximately 5% and approximately 40% of the thickness T prevents a buildup of oxygen vacancies at a distance that is difficult to remove (e.g., move to the upper electrode 116), thereby preventing a buildup of oxygen vacancies within the doped data storage structure 110. In some embodiments, the doped data storage structure 110 has a doping profile that is asymmetric along a thickness of the doped data storage structure 110.

In some embodiments, the doping profile 302 has a peak doping concentration $C_P$ (e.g., a molar percentage of the dopants) that is in a range of between approximately 1% and approximately 20%. In some additional embodiments, the doping concentration has a peak doping concentration $C_P$ that is in a range of between approximately 1% and approximately 10%. Having a doping concentration that is greater than approximately 20% may reduce a number of oxygen vacancies that are present in the doped data storage structure 110, thereby making it difficult to form a conductive filament within the doped data storage structure 110. Alternatively, having a doping concentration that is less than approximately 1% may fail to sufficiently mitigate an increase in excess oxygen vacancies within the doped data storage structure 110, and thereby does not mitigate degradation of a read window of an RRAM device.

Figure 4A:
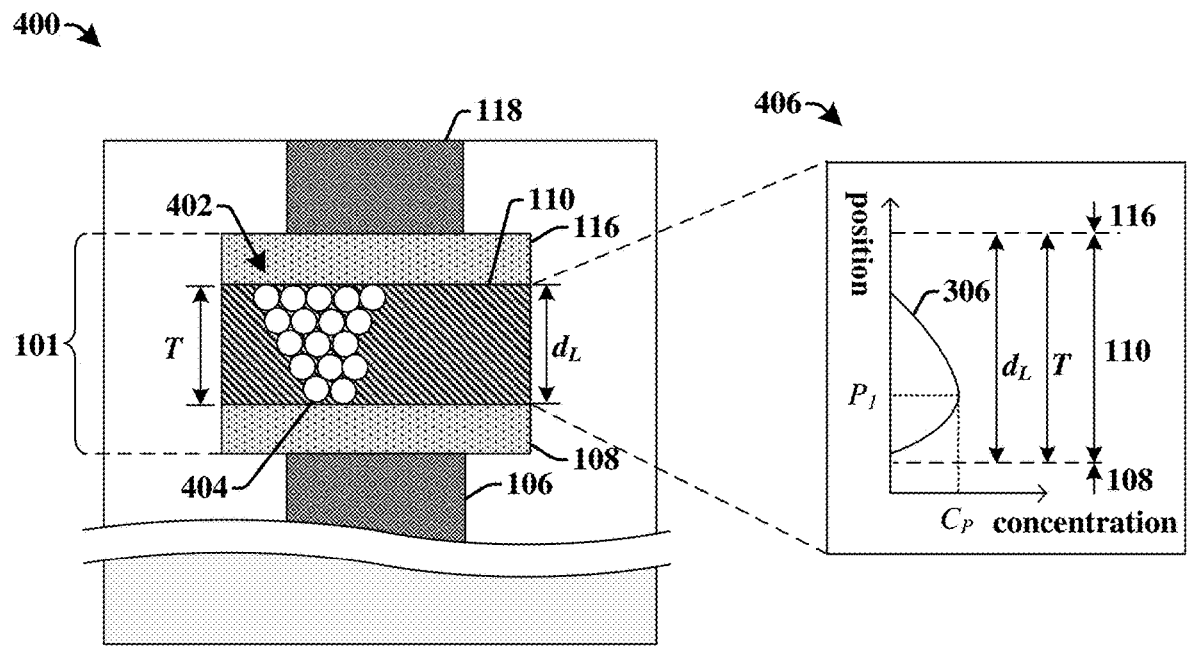
FIGS. 4A-4B illustrate some embodiments of operations of an RRAM device having a doped data storage structure.
Figure 4B:
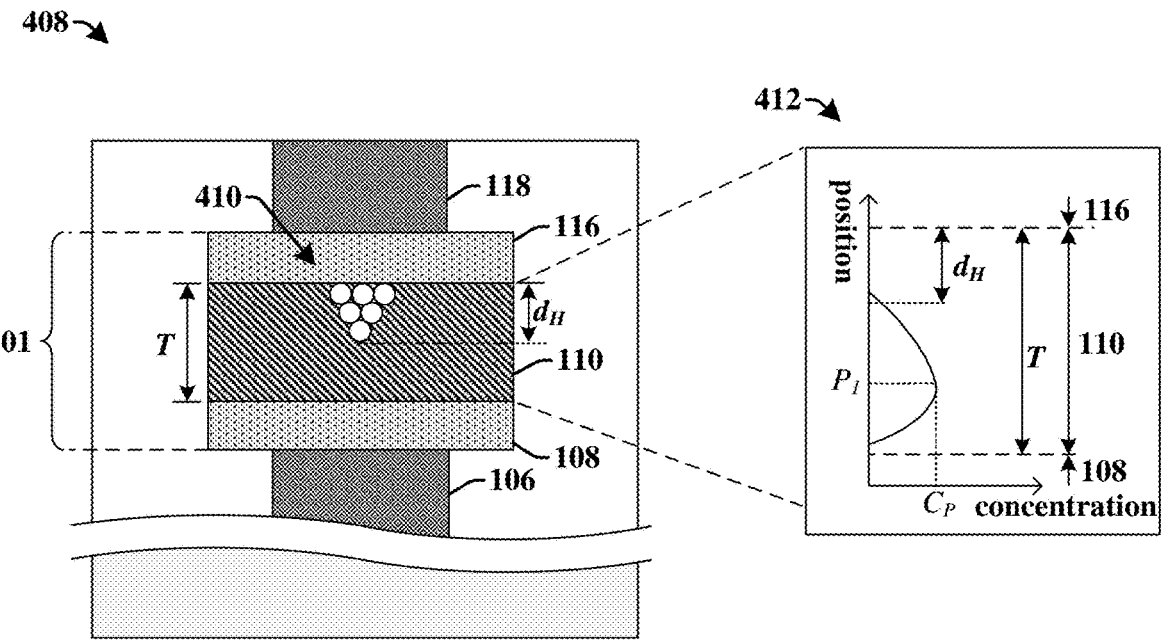

FIGS. 4A-4B illustrate cross-sectional views, 400 and 408, of some embodiments of an RRAM device during various stages of operation.

As shown in cross-sectional view 400 of FIG. 4A, the RRAM device 101 comprises a doped data storage structure 110 disposed between a lower electrode 108 and an upper electrode 116. In a low resistive state (e.g., storing a first data state "1"), a conductive filament 402 extends through the doped data storage structure 110 of the RRAM device 101 for a distance $d_L$ that is approximately equal to a thickness T of the doped data storage structure 110. The conductive filament 402 comprises a plurality of oxygen vacancies 404 that collectively define the conductive filament 402. As shown in graph 406, the conductive filament 402 vertically extends through a position $P_1$ of a peak doping concentration $C_P$ of the doped data storage structure 110. In some embodiments, a width of the conductive filament 402 decreases between the upper electrode 116 and the lower electrode 108.

Cross-sectional view 408 of FIG. 4B illustrates the RRAM device 101 in a high resistive state. In the high resistive state (e.g., storing a second data state "0"), a partial conductive filament 410 extend a distance $d_H$ ($d_H<d_L\approx T$) within the doped data storage structure 110. As shown in graph 412, the partial conductive filament 410 extends through the doped data storage structure 110 to a position that is vertically between the upper electrode 116 and the position $P_1$ of the peak doping concentration $C_P$. In other words, the partial conductive filament 410 does not vertically extend through the position $P_1$ of the peak doping concentration $C_P$ of the doped data storage structure 110. This is because the peak doping concentration $C_P$ results in a high number of oxygen-dopant bonds having a relatively high bond energy (e.g., a bond energy that is greater than that of oxygen-oxygen bonds). The relatively high bond energy mitigates a number of excess oxygen vacancies within a lower part of the doped data storage structure 110.

Figure 5:
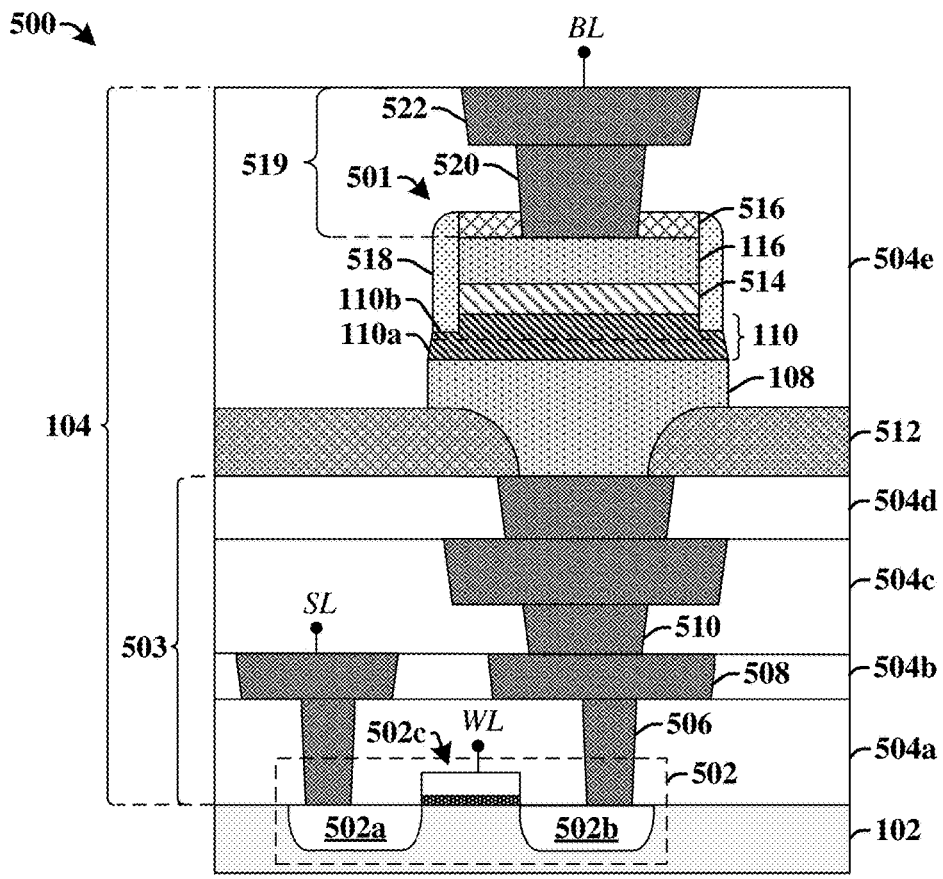
FIG. 5 illustrates a cross-sectional view of some embodiments of an integrated chip comprising an RRAM device having a doped data storage structure.

FIG. 5 illustrate some additional embodiments of an integrated chip 500 having an RRAM device with a doped data storage structure.

The integrated chip 500 comprises an RRAM device 501 disposed within an inter-level dielectric (ILD) structure 104 arranged over a substrate 102. In some embodiments, the ILD structure 104 comprises a plurality of stacked inter-level dielectric (ILD) layers 504a-504e. The plurality of stacked ILD layers 504a-504e comprise one or more lower ILD layers 504a-504d that laterally surround one or more lower interconnect layers 503 comprising conductive contacts 506, interconnect wires 508, and interconnect vias 510. In some embodiments, the plurality of stacked ILD layers 504a-504e may comprise one or more of silicon dioxide, SiCOH, a fluorosilicate glass, a phosphate glass (e.g., borophosphate silicate glass), or the like. In some embodiments, the one or more lower interconnect layers 503 may comprise a conductive metal such as copper, aluminum, and/or tungsten, for example. In some embodiments, two or more adjacent ones of the plurality of stacked ILD layers 504a-504e may be separated by an etch stop layer (not shown) comprising a nitride, a carbide, or the like.

The one or more lower interconnect layers 503 are configured to couple the RRAM device 501 to an access device 502 arranged within the substrate 102. In some embodiments, the access device 502 may comprise a MOSFET device having a gate structure 502c that is laterally arranged between a source region 502a and a drain region 502b. In some embodiments, the gate structure 502c may comprise a gate electrode that is separated from the substrate 102 by a gate dielectric. In some such embodiments, the source region 502a is coupled to a source-line SL and the gate structure 502c is coupled to a word-line WL. In other embodiments, the access device 502 may comprise a HEMT, a BJT, a JFET, or the like.

A lower insulating layer 512 is over the one or more lower ILD layers 504a-504d and comprises sidewalls that define an opening extending through the lower insulating layer 512. In various embodiments, the lower insulating layer 512 may comprise silicon nitride, silicon dioxide, silicon carbide, or the like.

The RRAM device 501 is arranged between the sidewalls of the lower insulating layer 512 and over the lower insulating layer 512. In some embodiments, the RRAM device 501 comprises a lower electrode 108 that is separated from an upper electrode 116 by way of a doped data storage structure 110. In some embodiments, the lower electrode 108 and the upper electrode 116 may comprise a metal, such as tantalum, titanium, tantalum nitride, titanium nitride, platinum, nickel, hafnium, zirconium, ruthenium, iridium, or the like. In some embodiments, the lower electrode 108 may comprise a diffusion barrier layer (e.g., tantalum nitride) and an overlying metal (e.g., titanium).

In some embodiments, the doped data storage structure 110 may comprise a first data storage layer 110a having a non-zero doping concentration and a second data storage layer 110b having a substantially zero doping concentration. In some embodiments, the first data storage layer 110a may have an upper surface completely covered by the second data storage layer 110b. In some additional embodiments, the second data storage layer 110b may have a smaller thickness laterally outside of the upper electrode 116 than directly below the upper electrode 116.

In some embodiments, a capping layer 514 is arranged between the doped data storage structure 110 and the upper electrode 116. The capping layer 514 is configured to store oxygen, which can facilitate resistance changes within the doped data storage structure 110. In some embodiments, the capping layer 514 may comprise a metal such as titanium, tantalum, hafnium, platinum, aluminum, or the like. In other embodiments, the capping layer 514 may comprise a metal nitride, such as titanium nitride, tantalum nitride, or the like. In yet other embodiments, the capping layer 514 may comprise a metal oxide such as titanium oxide, hafnium oxide, zirconium oxide, germanium oxide, cesium oxide, or the like. In some alternative embodiments, the capping layer 514 may be arranged between the lower electrode 108 and the doped data storage structure 110. In such embodiments, the doped data storage structure 110 may have a peak doping concentration that is closer to a top of the doped data storage structure 110 than a bottom of the doped data storage structure 110.

In some embodiments, a masking layer 516 may be disposed over the upper electrode 116. In some embodiments, the masking layer 516 may comprise silicon oxynitride, silicon dioxide, plasma enhanced silicon nitride, or the like. In some embodiments, a sidewall spacer 518 may be disposed along sidewalls of the capping layer 514 and the upper electrode 116. In some embodiments, the sidewall spacer 518 may comprise an oxide (e.g., silicon rich oxide), a nitride (e.g., silicon nitride), a carbide (e.g., silicon carbide), or the like. In some embodiments, the sidewall spacer 518 may be a same material as the masking layer 516, such that the same material continuously extends along sidewalls and an upper surface of the upper electrode 116. The sidewall spacer 518 and the masking layer 516 are arranged between the RRAM device 501 and an upper ILD layer 504e of the plurality of stacked ILD layers 504a-504e.

In some embodiments, an upper interconnect structure 519 is coupled to the upper electrode 116. In some embodiments, the upper interconnect structure 519 may comprise a top electrode via 520 and an upper interconnect wire 522 over the top electrode via 520. The top electrode via 520 extends through the masking layer 516 to contact the upper electrode 116. In some embodiments, the top electrode via 520 and/or the upper interconnect wire 522 may comprise aluminum, copper, tungsten, or the like. In some embodiments, the upper interconnect wire 522 is further coupled to a bit-line BL.

Figure 6:
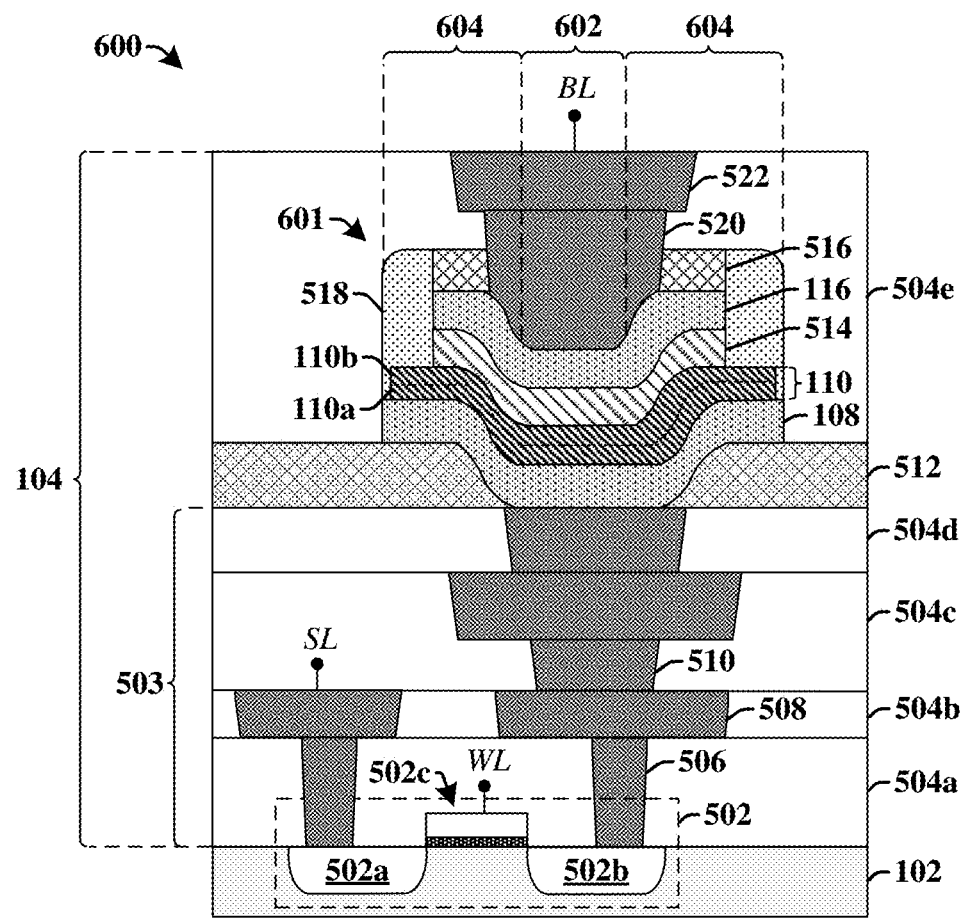
FIG. 6 illustrates a cross-sectional view of some alternative embodiments of an integrated chip comprising an RRAM device having a doped data storage structure.

FIG. 6 illustrates some alternative embodiments of an integrated chip 600 having an RRAM device with a doped data storage structure.

The integrated chip 600 comprises an RRAM device 601 having a lower electrode 108 separated from an upper electrode 116 by a doped data storage structure 110 and a capping layer 514. The lower electrode 108, the doped data storage structure 110, the capping layer 514, and the upper electrode 116 respectively have an inner region 602 laterally surrounded by an outer region 604. Layers within the inner region 602 respectively have a recessed upper surface arranged laterally between and vertically below upper surfaces of a corresponding layer within the outer region 604. For example, the doped data storage structure 110 has an upper surface within the inner region 602 that is laterally between and vertically below upper surfaces of the doped data storage structure 110 within the outer region 604. In some embodiments, the outer region 604 may continually extend in an unbroken ring around the inner region 602 when viewed in a top-view of the RRAM device 601.

In some embodiments, the lower electrode 108, the doped data storage structure 110, the capping layer 514, and the upper electrode 116 may respectively have a substantially equal thickness between outermost sidewalls. In some alternative embodiments, the inner region 602 of the doped data storage structure 110 may have a first thickness and the outer region 604 of the doped data storage structure 110 may have a second thickness that is less than the first thickness.

FIGS. 7-17 illustrate some embodiments of cross-sectional views 700-1700 showing a method of forming an integrated chip comprising an RRAM device having a doped data storage structure. Although FIGS. 7-17 are described in relation to a method, it will be appreciated that the structures disclosed in FIGS. 7-17 are not limited to such a method, but instead may stand alone as structures independent of the method.

Figure 7:
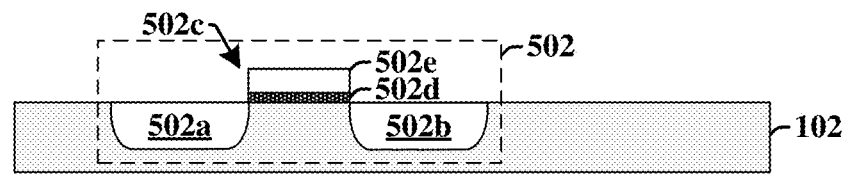
FIGS. 7-17 illustrate some embodiments of cross-sectional views showing a method of forming an integrated chip comprising an RRAM device having a doped data storage structure.

As shown in cross-sectional view 700 of FIG. 7, an access device 502 is formed within a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the access device 502 may comprise a transistor formed by depositing a gate dielectric film and a gate electrode film over the substrate 102. The gate dielectric film and the gate electrode film are subsequently patterned to form a gate structure 502c having a gate dielectric 502d and a gate electrode 502e. The substrate 102 may be subsequently implanted to form a source region 502a and a drain region 502b within the substrate 102 on opposing sides of the gate structure 502c.

Figure 8:
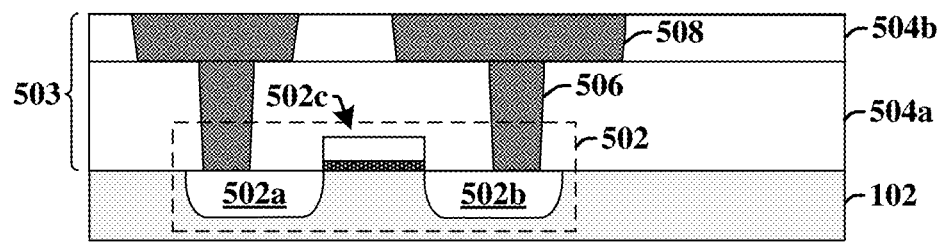

As shown in cross-sectional view 800 of FIG. 8, one or more lower interconnect layers 503 are formed within one or more lower inter-level dielectric (ILD) layers 504a-504b over the substrate 102. In some embodiments, the one or more lower interconnect layers 503 may comprise conductive contacts 506 and interconnect wires 508. The one or more lower interconnect layers 503 may be formed by forming one of the one or more lower ILD layers 504a-504b over the substrate 102, selectively etching the ILD layer (e.g., an oxide, a low-k dielectric, or an ultra low-k dielectric) to define a via hole and/or a trench within the ILD layer, forming a conductive material (e.g., copper, aluminum, etc.) within the via hole and/or a trench, and performing a planarization process (e.g., a chemical mechanical planarization process).

Figure 9:
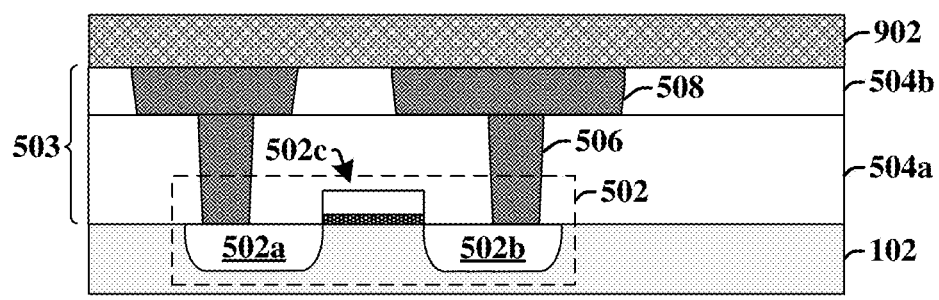

As shown in cross-sectional view 900 of FIG. 9, a lower insulating layer 902 is formed onto the one or more lower interconnect layers 503 and the one or more lower ILD layers 504a-504b. In some embodiments, the lower insulating layer 902 may comprise silicon-nitride, silicon-carbide, or a similar composite dielectric film. In some embodiments, the lower insulating layer 902 may be formed by a deposition technique (e.g., physical vapor deposition (PVD), chemical vapor deposition (CVD), PE-CVD, atomic layer deposition (ALD), etc.) to a thickness in a range of between approximately 200 angstroms and approximately 300 angstroms.

Figure 10:
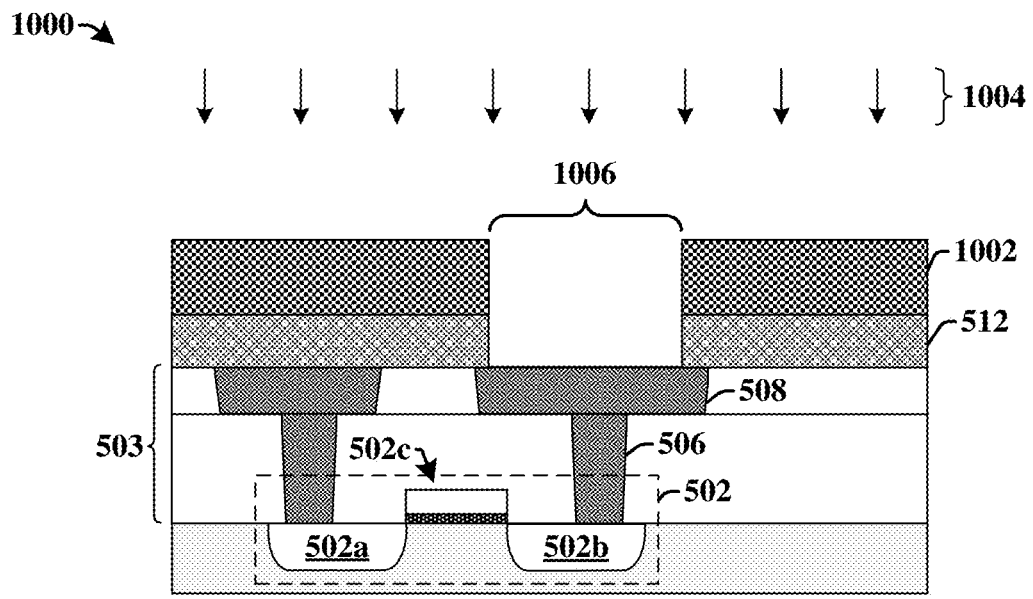

As shown in cross-sectional view 1000 of FIG. 10, a first masking layer 1002 is formed over the lower insulating layer (902 of FIG. 9). The lower insulating layer (902 of FIG. 9) is then selectively exposed to a first etchant 1004 (e.g., a dry etchant) in areas not covered by the first masking layer 1002. The first etchant 1004 defines an opening 1006 in the lower insulating layer 512, which extends through the lower insulating layer 512 to the one or more lower interconnect layers 503.

Figure 11:
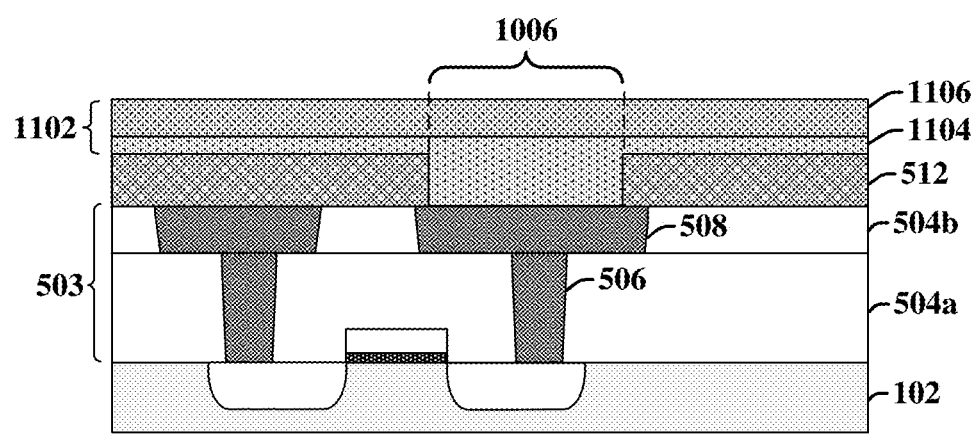

As shown in cross-sectional view 1100 of FIG. 11, a lower electrode structure 1102 is formed over the one or more lower interconnect layers 503 and the lower insulating layer 512. In some embodiments, the lower electrode structure 1102 is formed by depositing one or more lower electrode films 1104-1106. For example, the lower electrode structure 1102 may be formed by depositing a first lower electrode film 1104 and subsequently depositing a second lower electrode film 1106 over the first lower electrode film 1104. The first lower electrode film 1104 extends from within the opening 1006 to a position overlying the lower insulating layer 512. In some embodiments, the first lower electrode film 1104 may comprise tantalum nitride, titanium nitride, or the like. A planarization process (e.g., a chemical mechanical planarization process) may subsequently be performed. In some embodiments, the planarization process results in the first lower electrode film 1104 having a thickness in a range of between approximately 100 angstroms and approximately 300 angstroms over the lower insulating layer 512. The second lower electrode film 1106 is formed over the first lower electrode film 1104. In some embodiments, the second lower electrode film 1106 may comprise tantalum, titanium, or the like. In some embodiments, the second lower electrode film 1106 may be formed to a thickness in a range of between approximately 100 angstroms and approximately 200 angstroms.

FIGS. 12A-12D illustrate cross-sectional views showing some embodiments of forming a doped data storage element 1220. FIGS. 12A-12D form the doped data storage element 1220 by way of deposition processes followed by separate doping processes. Although FIGS. 12A-12D illustrate the formation of a doped data storage element 1220 comprising two data storage layers, it will be appreciated that a larger number of data storage layers (e.g., 10, 100, 1000, etc.) may be formed within the doped data storage element 1220. For example, in some embodiments, the acts of FIGS. 12A-12B may be repeated to form a plurality of doped data storage layers (e.g., a first doped data storage layer having a first doping concentration and a second doped data storage layer having a second doping concentration that is greater than the first doping concentration) followed by the acts of FIG. 12C and/or FIG. 12D to form one or more un-doped data storage layers and/or one or more doped data storage layers (e.g., having a third doping concentration that is less than the second doping concentration).

Figure 12A:
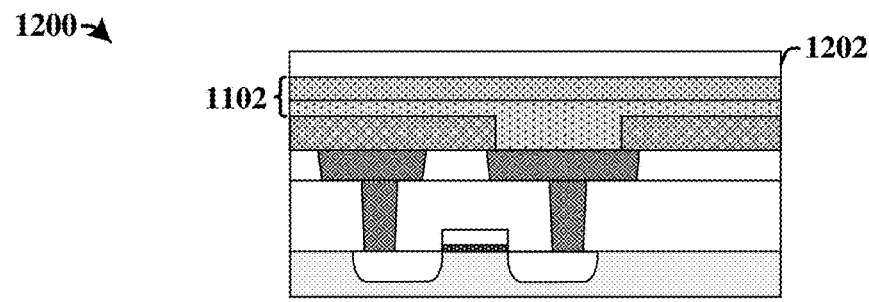

As shown in cross-sectional view 1200 of FIG. 12A, a first un-doped data storage layer 1202 is formed over the lower electrode structure 1102. In some embodiments, the first un-doped data storage layer 1202 may be formed by a first ALD cycle that sequentially alternates pulses of gaseous chemical precursors. For example, during the first ALD cycle, a precursor (e.g., tetrakis(ethylmethylamido)hafnium (TEMAHf), hafnium dioxide, hafnium tetrachloride, zirconium tetrachloride, a tantalum based precursor, or the like) is provided to a processing chamber under vacuum. Subsequently, the processing chamber is purged with an inert carrier gas (e.g., nitrogen, argon, or the like) to remove any unreacted precursor or reaction by-products. A counter-reactant precursor (e.g., oxygen, water, or the like) is then introduced into the processing chamber to form the first un-doped data storage layer 1202. The processing chamber is subsequently purged with an inert carrier gas (e.g., nitrogen, argon, or the like).

Figure 12B:
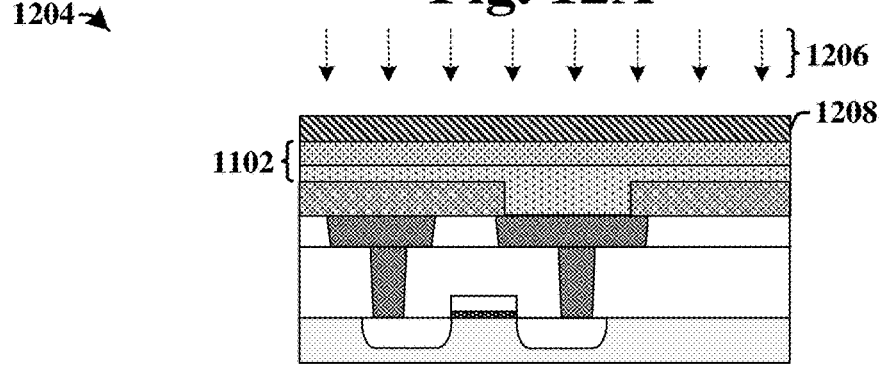

As shown in cross-sectional view 1204 of FIG. 12B, the first un-doped data storage layer (e.g., 1202 of FIG. 12A) is doped by exposing the first un-doped data storage layer to dopants 1206 to form a first doped data storage layer 1208 having a first dopant concentration. In some embodiments, the first un-doped data storage layer 1202 may be doped by way of a plasma treatment. For example, the first un-doped data storage layer 1202 may be exposed to a nitrogen containing plasma (e.g., an $N_2$ plasma). In other embodiments, the first un-doped data storage layer 1202 may be doped by a diffusion doping process. For example, the first un-doped data storage layer 1202 may be exposed to a nitrogen gas at an elevated temperature (e.g., greater than 100° C.). In yet other embodiments, the first un-doped data storage layer 1202 may be doped by alternative methods, such as an implantation process or the like.

In some embodiments, the first un-doped data storage layer 1202 may be formed and doped in-situ (e.g., without breaking vacuum between the formation and doping of the first un-doped data storage layer 1202). In some such embodiments, the first un-doped data storage layer 1202 may be formed and doped within a same processing chamber. In other such embodiments, the first un-doped data storage layer 1202 may be formed within a first processing chamber and doped within a second processing chamber. In other embodiments, the first un-doped data storage layer 1202 may be formed and doped ex-situ (e.g., with breaking vacuum between the formation and doping of the first un-doped data storage layer 1202).

Figure 12C:
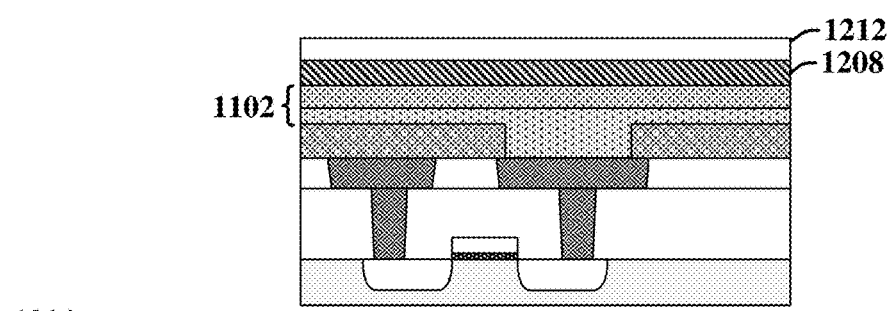

As shown in cross-sectional view 1210 of FIG. 12C, a second un-doped data storage layer 1212 is formed over the first doped data storage layer 1208. The second un-doped data storage layer 1212 may be formed by a second ALD cycle that sequentially alternates pulses of gaseous chemical precursors. In some embodiments, the second ALD cycle may be performed by a same process as the first ALD cycle (described in relation to FIG. 12A). In some embodiments, the second un-doped data storage layer 1212 may be formed in-situ with the first doped data storage layer 1208.

Figure 12D:
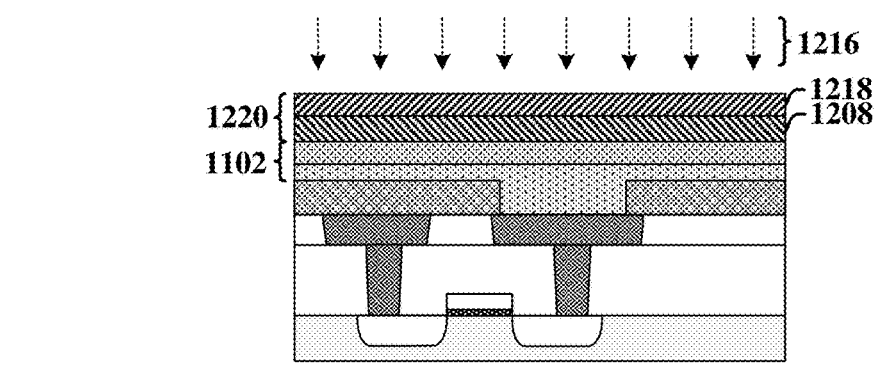

As shown in cross-sectional view 1214 of FIG. 12D, in some embodiments, the second un-doped data storage layer (1212 of FIG. 12C) is doped by exposing the second un-doped data storage layer to dopants 1216 to form a second data storage layer 1218 having a non-zero doping concentration and to define the doped data storage element 1220. In various embodiments, the second un-doped data storage layer 1212 may be doped by a plasma treatment, a thermal annealing process, an implantation process, or the like. In some embodiments, the second un-doped data storage layer 1212 is doped to a second dopant concentration that is different than (e.g. greater than or less than) the first doping concentration. In some embodiments, the first and second doping concentrations may be discrete (e.g., discontinuous) at an interface between the first doped data storage layer 1208 and the second data storage layer 1218, while in other embodiments the first and second doping concentrations may be continuous over the interface. In some embodiments, the second un-doped data storage layer 1212 may be formed and doped in-situ. In some embodiments, due to doping of the second un-doped data storage layer, the first doped data storage layer 1208 may have a greater dopant concentration along an upper surface than along a lower surface.

In other embodiments, doping of the second un-doped data storage layer (1212 of FIG. 12C) may be skipped (e.g., so that a capping film is formed directly onto the second un-doped data storage layer 1212 of FIG. 12C). In such embodiments, the doped data storage element 1220 may have a doping profile with a substantially zero doping concentration that continuously extends from a top of the doped data storage element 1220 to a top surface of the first doped data storage layer 1208.

FIGS. 13A-13D illustrate cross-sectional views showing some alternative embodiments of forming a doped data storage element 1220. FIGS. 13A-13D form the doped data storage element 1220 by way of an atomic layer deposition (ALD) process that includes a dopant. Although FIGS. 13A-13D illustrate the formation of two data storage layers, it will be appreciated that a larger number of data storage layers (e.g., 10, 100, 1000, etc.) may be formed within a doped data storage element 1220. Furthermore, although FIGS. 13A-13D describe the formation of the doped data storage element 1220 using an ALD process, in other embodiments alternative deposition processes (e.g., CVD, PVD, etc.) may be used to form the doped data storage element 1220.

Figure 13A:
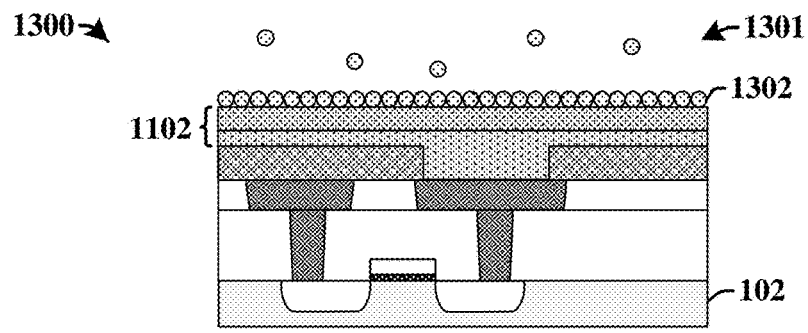

As shown in cross-sectional view 1300 of FIG. 13A, a first monolayer 1302 is formed over the lower electrode structure 1102. In some embodiments, the first monolayer 1302 may be formed by introducing a precursor gas 1301 into a processing chamber under vacuum. In some embodiments, the precursor gas 1301 may comprise tetrakis(ethylmethylamido)hafnium (TEMAHf), hafnium dioxide, hafnium tetrachloride, zirconium tetrachloride, a tantalum based precursor, or the like. Subsequently, the processing chamber is purged with an inert carrier gas (e.g., nitrogen, argon, or the like) to remove any by-products of the precursor gas 1301.

Figure 13B:
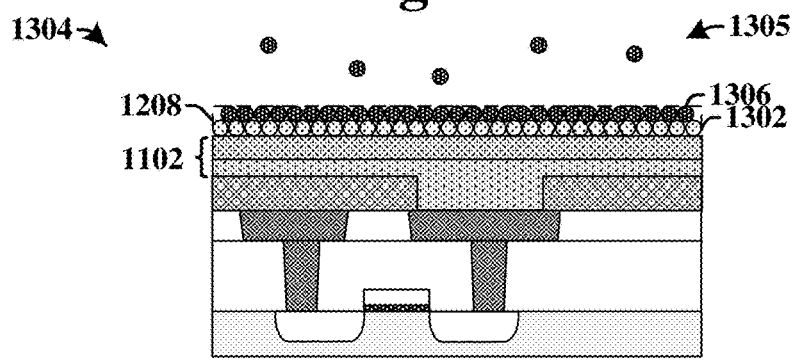

As shown in cross-sectional view 1304 of FIG. 13B, a second monolayer 1306 is formed over the first monolayer 1302 to form a first doped data storage layer 1208. In some embodiments, the second monolayer 1306 may be formed by introducing a dopant containing counter-reactant precursor gas 1305 into the processing chamber. In some embodiments, the dopant containing counter-reactant precursor gas 1305 may comprise ammonium ($NH_4$), ammonium nitride dissolved in water, ammonium hydroxide, or the like. Molecules of the dopant containing counter-reactant precursor gas 1305 interact with the first monolayer 1302 to form a first doped data storage layer 1208 having a first dopant concentration.

Figure 13C:
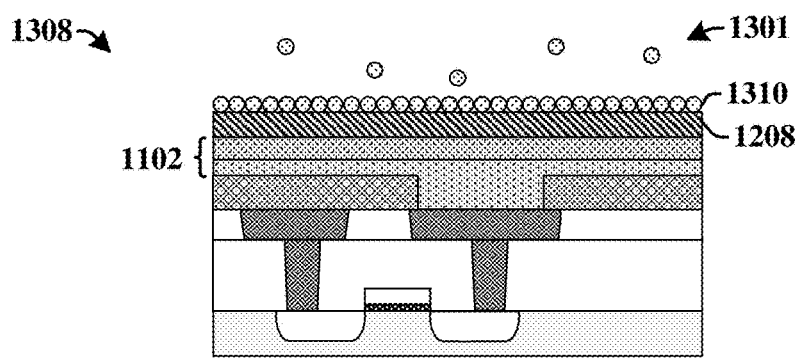

As shown in cross-sectional view 1308 of FIG. 13C, a third monolayer 1310 is formed over the first doped data storage layer 1208. The third monolayer 1310 may be formed by introducing the precursor gas 1301 into the processing chamber under vacuum. In some embodiments, the precursor gas 1301 may comprise tetrakis(ethylmethylamido)hafnium (TEMAHf), hafnium dioxide, hafnium tetrachloride, a tantalum based precursor, or the like. Subsequently, the processing chamber is purged with an inert carrier gas (e.g., nitrogen, argon, or the like) to remove any unreacted precursor or reaction by-products.

Figure 13D:
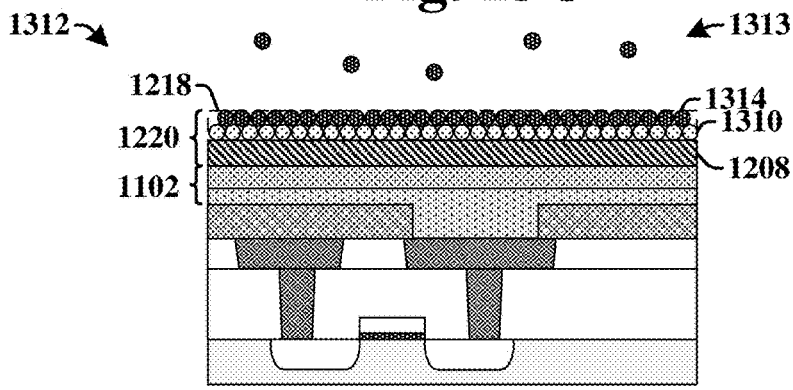

As shown in cross-sectional view 1312 of FIG. 13D, in some embodiments a fourth monolayer 1314 is formed over the third monolayer 1310. Molecules of the fourth monolayer 1314 interact with the third monolayer 1310 to form a second data storage layer 1218 and to define the doped data storage element 1220. In some embodiments, the fourth monolayer 1314 may be formed by introducing a dopant containing counter-reactant precursor gas 1313 into the processing chamber, so that the second data storage layer 1218 has a non-zero doping concentration. In some such embodiments, the dopant containing counter-reactant precursor gas 1305 may comprise ammonium ($NH_4$), ammonium nitride dissolved in water, ammonium hydroxide, or the like. In other embodiments, the fourth monolayer 1314 may be formed by introducing a counter-reactant precursor gas that is devoid of the dopant into the processing chamber, so that the second data storage layer 1218 has a substantially zero doping concentration. In some such embodiments, the counter-reactant precursor gas may comprise oxygen, water, or the like.

Figure 14:
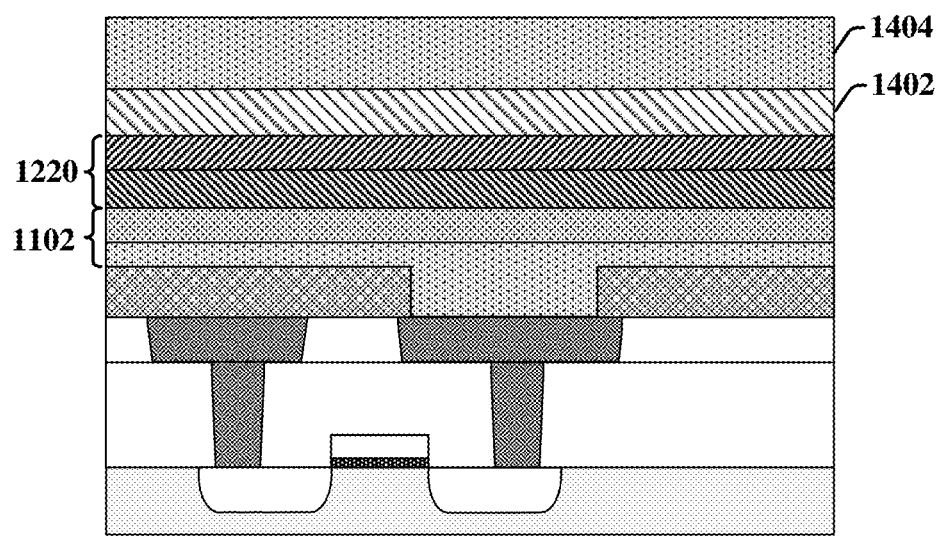

As shown in cross-sectional view 1400 of FIG. 14, a capping film 1402 may be formed over the doped data storage element 1220, in some embodiments. In various embodiments, the capping film 1402 may comprise titanium, tantalum, titanium nitride, tantalum nitride, hafnium, aluminum, or a similar material. In some alternative embodiments, the capping film 1402 may be formed prior to forming the doped data storage element 1220, so that the capping film 1402 is between the lower electrode structure 1102 and the doped data storage element 1220. In some embodiments, the capping film 1402 may be formed by way of a deposition technique (e.g., PVD, CVD, PE-CVD, sputtering, ALD, etc.).

An upper electrode structure 1404 is subsequently formed over the capping film 1402. In some embodiments, the upper electrode structure 1404 may comprise a metal, such as titanium, tantalum, or the like. In some embodiments, the upper electrode structure 1404 may be formed by way of a deposition technique (e.g., PVD, CVD, PE-CVD, sputtering, ALD, etc.).

As shown in FIGS. 15A-15E, one or more patterning processes are performed to define an RRAM device 501.

Figure 15A:
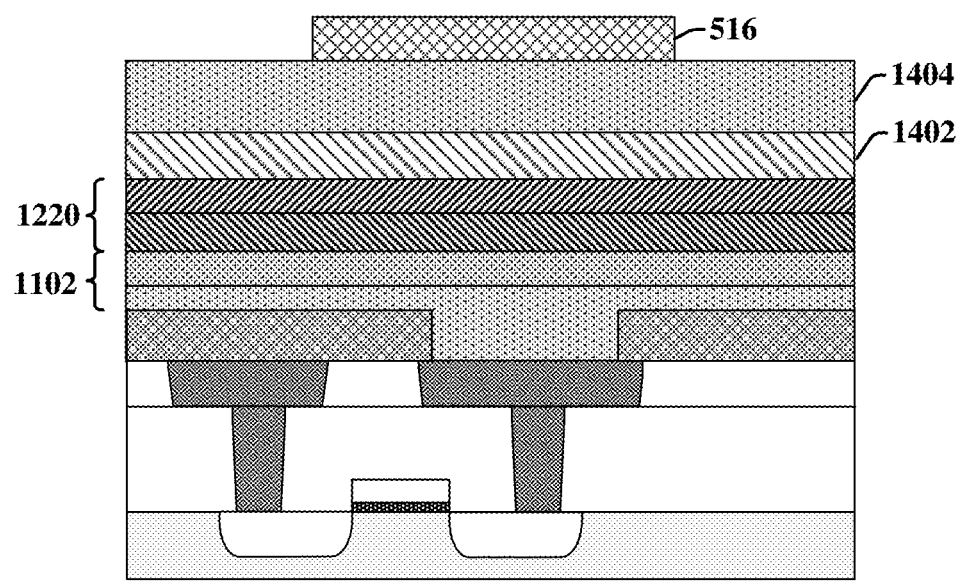

As shown in cross-sectional view 1500 of FIG. 15A, a masking layer 516 is formed over the upper electrode structure 1404. In some embodiments, the masking layer 516 may comprise a nitride, a carbide, or the like. In some embodiments, the masking layer 516 may be formed by a deposition process (e.g., CVD, PVD, PE-CVD, ALD, or the like) and a subsequent lithographic patterning process.

As shown in cross-sectional view 1502 of FIG. 15B, the upper electrode structure (1404 of FIG. 15A) and the capping film (1402 of FIG. 15A) are exposed to one or more etchants 1504. The one or more etchants 1504 are configured to define an upper electrode 116 by selectively removing unmasked parts of the upper electrode structure (1404 of FIG. 15A) and to further define a capping layer 514 by selectively removing unmasked parts of the capping film (1402 of FIG. 15A). In some embodiments, the one or more etchants 1504 may also remove unmasked parts of the doped data storage element (1220 of FIG. 14) and/or the lower electrode structure (1102 of FIG. 14). In various embodiments, the one or more etchants 1504 may comprise a dry etchant having an etching chemistry comprising a chlorine and/or fluorine species (e.g., $CF_4$, $CHF_3$, $C_4F_8$, etc.) and/or a wet etchant comprising hydroflouric acid (HF), KOH, or the like.

As shown in cross-sectional view 1506 of FIG. 15C, a spacer layer 1508 is formed over the substrate 102. In some embodiments, the spacer layer 1508 covers upper surfaces of the data storage element 1220 and the masking layer 516. In some such embodiments, the spacer layer 1508 may further cover sidewalls of the capping layer 514, the upper electrode 116, and the masking layer 516. In some embodiments, the spacer layer 1508 may comprise an oxide, a nitride, a carbide, or the like. In some embodiments, the spacer layer 1508 may comprise a same material as the masking layer 516. In some embodiments, the spacer layer 1508 may be formed by way of a deposition process (e.g., CVD, PVD, PE-CVD, etc.).

As shown in cross-sectional view 1510 of FIG. 15D, the spacer layer (1508 of FIG. 15C) is exposed to one or more etchants 1512. The one or more etchants 1512 remove the spacer layer (1508 of FIG. 15C) from horizontal surfaces, leaving the spacer layer (1508 of FIG. 15C) along opposing sides of the upper electrode 116 as the sidewall spacer 518. In various embodiments, the one or more etchants 1512 may comprise a dry etchant and/or a wet etchant.

As shown in cross-sectional view 1514 of FIG. 15E, the data storage structure (1220 of FIG. 15D) and/or the lower electrode structure (1102 of FIG. 15D) are selectively exposed to one or more etchants 1516. The one or more etchants are configured to define a data storage structure 110 and/or a lower electrode 108 of an RRAM device 501. In some embodiments, the data storage structure (1220 of FIG. 15D) and/or the lower electrode structure (1102 of FIG. 15D) are selectively patterned according to a mask comprising the sidewall spacer 518 and the masking layer 516. In various embodiments, the one or more etchants 1516 may comprise a dry etchant and/or a wet etchant.

Figure 16:
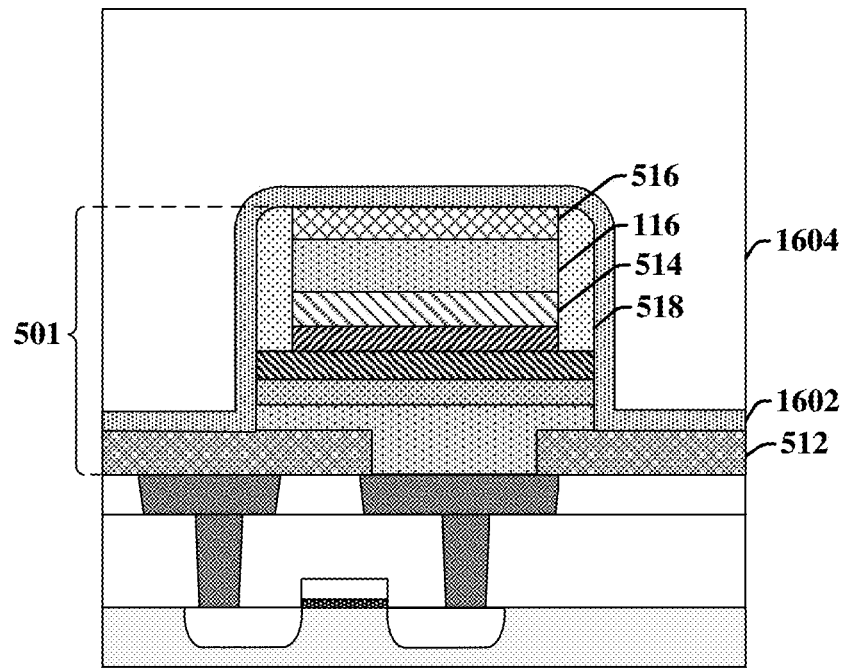

As shown in cross-sectional view 1600 of FIG. 16, an encapsulation layer 1602 may be formed over the RRAM device 501 and the lower insulating layer 512. An upper inter-level dielectric (ILD) layer 1604 is subsequently formed over the encapsulation layer 1602. The encapsulation layer 1602 has a first side that abuts the lower electrode 108, the doped data storage structure 110, and the sidewall spacer 518, and a second side that abuts the upper ILD layer 1604. In some embodiments, the encapsulation layer 1602 may comprise a nitride, a carbide, an oxide, or the like.

Figure 17:
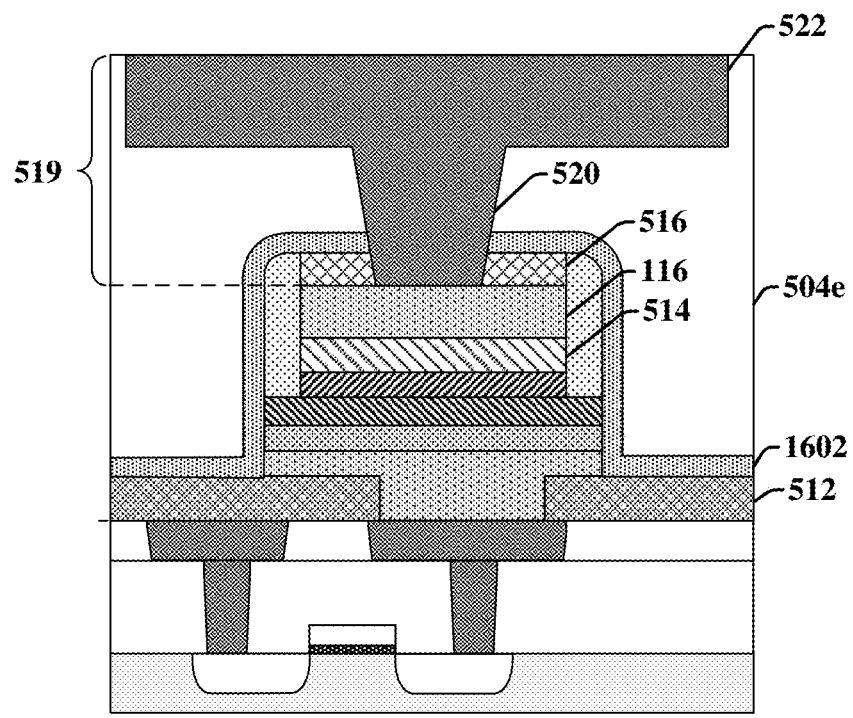

As shown in cross-sectional view 1700 of FIG. 17, an upper interconnect structure 519 is formed within the upper ILD layer 504e. The upper interconnect structure 519 extends through the upper ILD layer 504e to a position abutting the upper electrode 116. In some embodiments, the upper interconnect structure 519 comprises a top electrode via 520 and an upper interconnect wire 522. In some embodiments, the upper interconnect structure 519 may be formed by etching the upper ILD layer 504e to form an opening that extends through the encapsulation layer 1602, and the masking layer 516 to the upper electrode 116. The opening is then filled with a metal (e.g., copper and/or aluminum) to form the top electrode via 520 and the upper interconnect wire 522.

Figure 18:
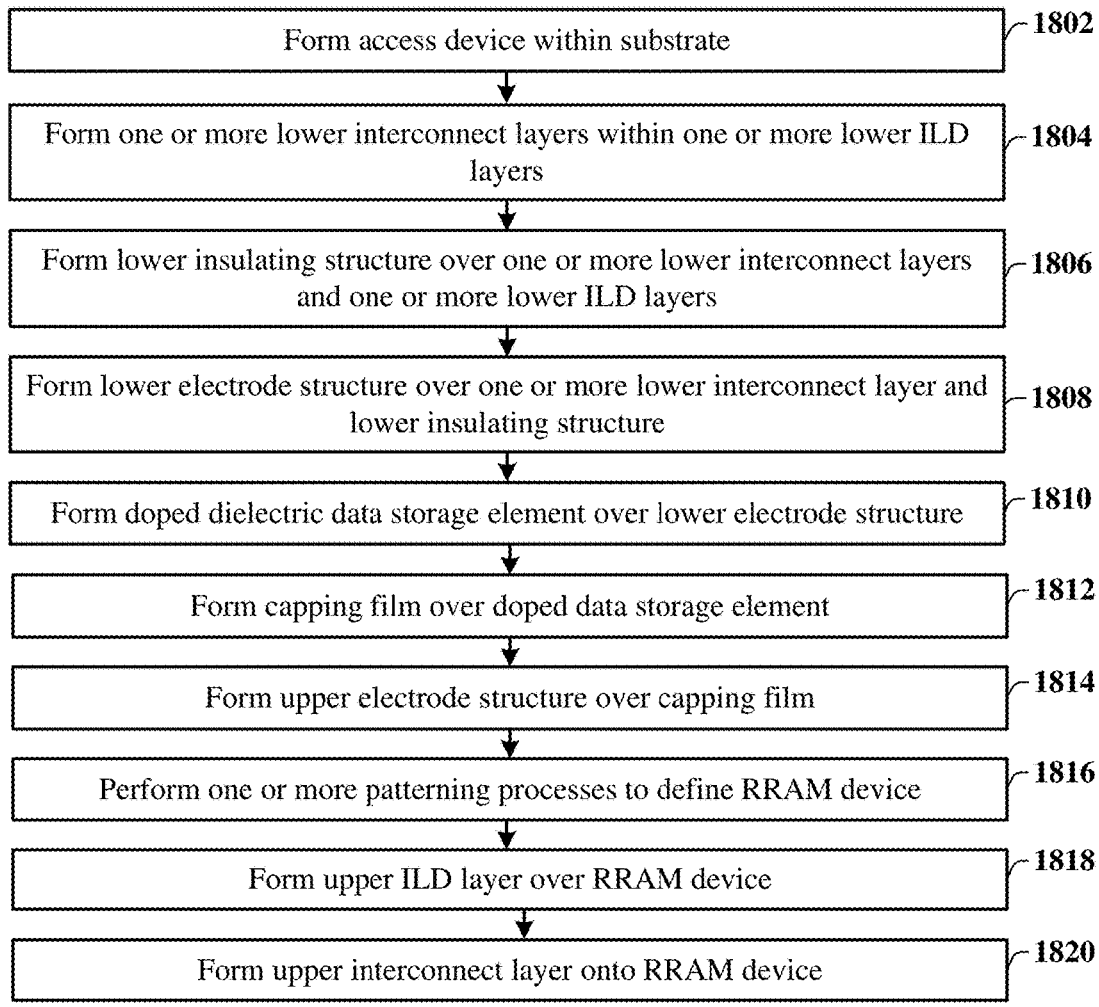
FIG. 18 illustrates a flow diagram of some embodiments of a method of forming an integrated chip comprising an RRAM device having a doped data storage structure.

FIG. 18 illustrates a flow diagram of some embodiments of a method 1800 of forming an integrated chip comprising an RRAM device having a doped data storage structure.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1802, an access device is formed within a substrate. FIG. 7 illustrates some embodiments of a cross-sectional view 700 corresponding to act 1802.

At act 1804, one or more lower interconnect layers 503 are formed within one or more lower inter-level dielectric (ILD) layers. FIG. 8 illustrates some embodiments of a cross-sectional view 800 corresponding to act 1804.

At act 1806, a lower insulating structure is formed over the one or more lower interconnect layers and the one or more lower ILD layers. FIGS. 9-10 illustrate some embodiments of a cross-sectional views 900-1000 corresponding to act 1806.

At act 1808, a lower electrode structure is formed over the one or more lower interconnect layer and the lower insulating structure. FIG. 11 illustrates some embodiments of a cross-sectional view 1100 corresponding to act 1808.

At act 1810, a doped data storage element is formed over the lower electrode structure. The doped data storage element may be formed by a multi-step process to comprise a plurality of data storage layers respectively different concentrations of a dopant, thereby causing the doped data storage element to have a dopant concentration that changes as a distance from the lower electrode structure changes. FIGS. 12A-12D illustrates some embodiments of cross-sectional views corresponding to act 1810. FIGS. 13A-13D illustrates some alternative embodiments of cross-sectional views corresponding to act 1810.

At act 1812, a capping film is formed over the doped data storage element, in some embodiments. FIG. 14 illustrates some embodiments of a cross-sectional view 1400 corresponding to act 1812.

At act 1814, an upper electrode structure is formed over the capping film. FIG. 14 illustrates some embodiments of a cross-sectional view 1400 corresponding to act 1814.

At act 1816, one or more patterning processes are performed to define an RRAM device. FIG. 15 illustrates some embodiments of a cross-sectional view 1500 corresponding to act 1816.

At act 1818, an upper ILD layer is formed over the RRAM device. FIG. 16 illustrates some embodiments of a cross-sectional view 1600 corresponding to act 1818.

At act 1820, an upper interconnect structure is formed onto the RRAM device. FIG. 17 illustrates some embodiments of a cross-sectional view 1700 corresponding to act 1820.

Figure 19:
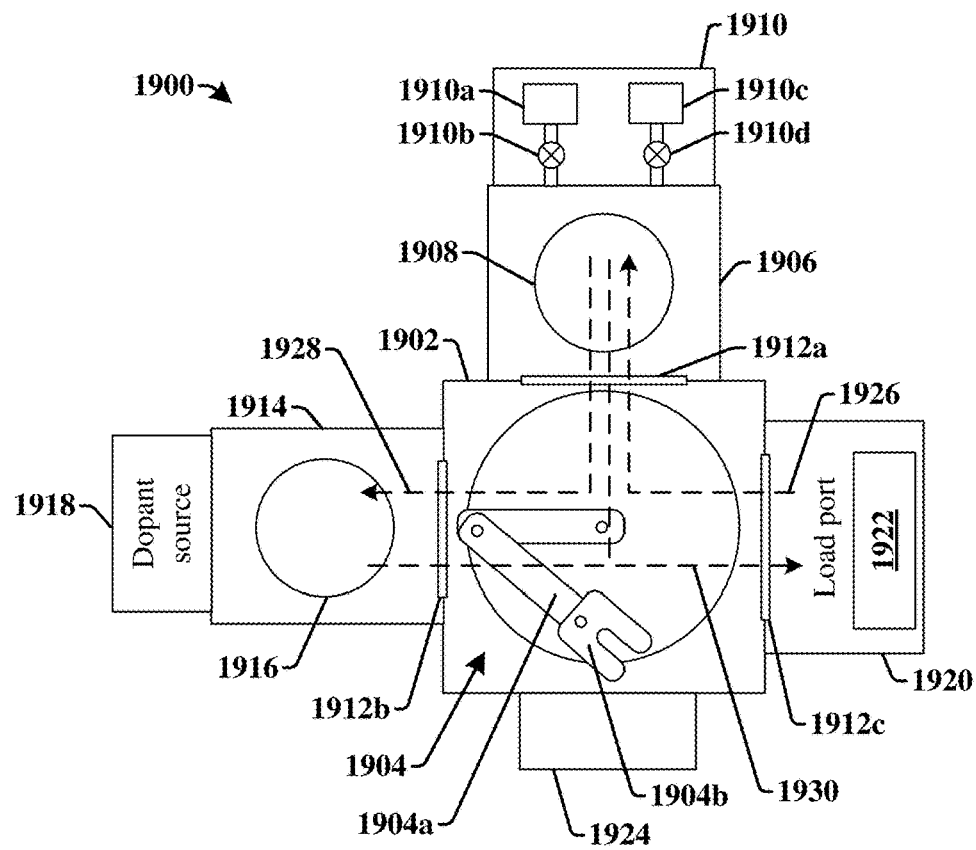
FIGS. 19-20 illustrate block diagrams showing some embodiments of processing tools configured to form a doped data storage structure of a disclosed RRAM device.

FIG. 19 illustrates a block diagram showing some embodiments of a processing tool 1900 configured to form a doped data storage structure of a disclosed RRAM device.

The processing tool 1900 comprises a transfer chamber 1902 coupled to a first processing chamber 1906, a second processing chamber 1914, and a load port 1920. In some embodiments, the transfer chamber 1902 may be coupled to the first processing chamber 1906 by way of a first door 1912a, to the second processing chamber 1914 by way of a second door 1912b, and to the load port 1920 by way of a third door 1912c. The transfer chamber 1902 comprises a wafer transfer robot 1904. In some embodiments, the wafer transfer robot 1904 may comprise a robotic arm 1904a coupled to a wafer blade 1904b configured to hold a wafer.

A first wafer chuck 1908 is arranged within the first processing chamber 1906. In some embodiments, the first wafer chuck 1908 may comprise a vacuum chuck. An ALD gas source 1910 is coupled to the first processing chamber 1906. The ALD gas source 1910 is configured to provide a precursor gas and a counter-reactant precursor to the first processing chamber 1906. In some embodiments, the ALD gas source 1910 may comprise a first gas source 1910*a* selectively coupled to the first processing chamber 1906 by way of a first valve 1910*b* and a second gas source 1910*c* selectively coupled to the first processing chamber 1906 by way of a second valve 1910*d*. In some embodiment, the first gas source 1910*a* may comprise a first temperature controlled bath and the second gas source 1910*c* may comprise a second temperature controlled bath. In some embodiments, the ALD gas source 1910 may further comprise a plasma source (not shown) configured to enhance the speed of an ALD process deposition.

A second wafer chuck 1916 is arranged within the second processing chamber 1914. A dopant source 1918 is coupled to the second processing chamber 1914 and is configured to provide a dopant to a substrate on the second wafer chuck 1916. In some embodiments, the dopant source 1918 may comprise an ion implantation tool, a vapor phase deposition tool, a plasma generator, or the like.

The load port 1920 is configured to receive a carrier 1922 holding one or more substrates. In various embodiments, the carrier 1922 may comprise a FOUP (a front opening unified pod), a wafer cassette, or the like. In some embodiments, the one or more substrates may comprise semiconductor wafers (e.g., 200 mm wafers, 300 mm wafers, 450 mm wafers, etc.).

One or more vacuum pumps 1924 are coupled to the transfer chamber 1902, the first processing chamber 1906, and/or the second processing chamber 1914. In some embodiments, the one or more vacuum pumps 1924 are configured to maintain a vacuum within the transfer chamber 1902, the first processing chamber 1906, and/or the second processing chamber 1914.

During operation, the wafer transfer robot 1904 is configured to provide a substrate from the carrier 1922 to the first processing chamber 1906 (along line 1926), where a first un-doped data storage layer (e.g., first un-doped data storage layer 1202 of FIG. 12A) is formed over the substrate. The wafer transfer robot 1904 is subsequently configured to transfer the substrate from the first processing chamber 1906 to the second processing chamber 1914 (along line 1928), where the first un-doped data storage layer is doped to form a first doped data storage layer (e.g., first doped data storage layer 1208 of FIG. 12B). The wafer transfer robot 1904 may subsequently transfer the substrate between the first processing chamber 1906 and the second processing chamber 1914 to form additional doped data storage layers (e.g., second data storage layer 1218 of FIG. 12D) that define a doped data storage element (e.g., doped data storage element 1220 of FIG. 12D). Once formation of the doped data storage element is complete, the wafer transfer robot 1904 transfers the substrate to the carrier 1922 within the transfer chamber 1902 (along line 1930).

Figure 20:
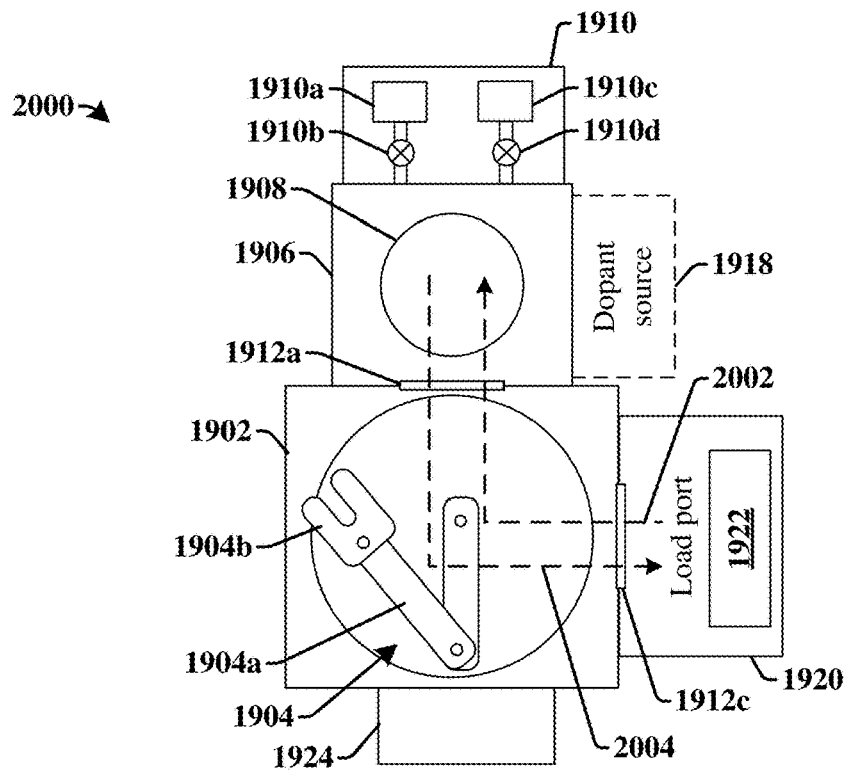

FIG. 20 illustrates a block diagram showing some alternative embodiments of a processing tool 2000 configured to form a doped data storage structure of a disclosed RRAM device.

The processing tool 2000 comprises a transfer chamber 1902 coupled to a first processing chamber 1906 and a load port 1920. In some embodiments, the transfer chamber 1902 may be coupled to the first processing chamber 1906 by way of a first door 1912*a* and to the load port 1920 by way of a second door 1912*b*. The transfer chamber 1902 comprises a wafer transfer robot 1904.

A first wafer chuck 1908 is arranged within the first processing chamber 1906. An ALD gas source 1910 is coupled to the first processing chamber 1906. The ALD gas source 1910 is configured to provide a precursor gas and a counter-reactant precursor to the first processing chamber 1906. In some embodiments, the ALD gas source 1910 may comprise a first gas source 1910*a* selectively coupled to the first processing chamber 1906 by way of a first valve 1910*b* and a second gas source 1910*c* selectively coupled to the first processing chamber 1906 by way of a second valve 1910*d*.

In some embodiments, the second gas source 1910*c* may be configured to provide a doped gas (e.g., a gas comprising nitrogen, fluorine, carbon, phosphorous, or the like) to the first processing chamber to form a doped data storage layer over a substrate. In such embodiments, during operation, the wafer transfer robot 1904 is configured to provide a substrate from a carrier 1922 to the first processing chamber 1906 (along line 2002), where a first doped data storage layer (e.g., first doped data storage layer 1208 of FIG. 13B) and additional data storage layers (e.g., second data storage layer 1218 of FIG. 13D) are formed over the substrate to define a doped data storage element (e.g., doped data storage element 1220 of FIG. 13D). Once formation of the doped data storage element is complete the wafer transfer robot 1904 transfers the substrate to the carrier 1922 within the transfer chamber 1902 (along line 2004).

In some alternative embodiments, a dopant source 1918 is coupled to the first processing chamber 1906 and is configured to provide a dopant to a substrate on the first wafer chuck 1908. In such embodiments, during operation, the wafer transfer robot 1904 is configured to provide a substrate from the carrier 1922 to the first processing chamber 1906 (along line 2002), where a first un-doped data storage layer (e.g., first un-doped data storage layer 1202 of FIG. 12A) is formed over the substrate. The dopant source 1918 is configured to subsequently doped the first un-doped data storage layer to form a first doped data storage layer (e.g., first doped data storage layer 1208 of FIG. 12B). One or more additional data storage layers (e.g., second data storage layer 1218 of FIG. 12D) are subsequently formed within the first processing chamber 1906 to define a doped data storage element (e.g., doped data storage element 1220 of FIG. 12D).

Therefore, the present disclosure relates to a resistive random access memory (RRAM) device having a doped data storage structure configured to provide the RRAM device with a good endurance (i.e., reliability), and an associated method of formation.

In some embodiments, the present disclosure relates to a method of forming a resistive random access memory (RRAM) device. The method includes forming a first electrode structure over a substrate; forming a doped data storage element over the first electrode structure by forming a first data storage layer over the first electrode structure, and forming a second data storage layer over the first data storage layer; forming a second electrode structure over the doped data storage element; and the first data storage layer is formed to have a first doping concentration of a dopant and the second data storage layer is formed to have a second doping concentration of the dopant that is less than the first doping concentration. In some embodiments, the first data storage layer and the second data storage layer are formed by atomic layer deposition processes. In some embodiments, forming the first data storage layer includes forming a first un-doped data storage layer over the first electrode structure; and doping the first un-doped data storage layer with the dopant to form the first data storage layer having the first doping concentration. In some embodiments, forming the doped data storage element further includes forming a second un-doped data storage layer over the first data storage layer; doping the second un-doped data storage layer to form the second data storage layer to have the second doping concentration; and forming a third data storage layer over the second data storage layer, the third data storage layer having a third doping concentration less than the second doping concentration. In some embodiments, the second data storage layer has a non-zero doping concentration. In some embodiments, the second data storage layer is formed in-situ with the first data storage layer. In some embodiments, the second data storage layer is formed to have a doping concentration that is substantially zero. In some embodiments, the dopant comprises nitrogen, fluorine, carbon, or phosphorous. In some embodiments, the doped data storage element is formed to a thickness; and the doped data storage element has a peak dopant concentration that is separated from the first electrode structure by a distance that is in a range of between approximately 5% and approximately 40% of the thickness. In some embodiments, the doped data storage element has a peak dopant concentration that is between approximately 1% and approximately 20%.

In other embodiments, the present disclosure relates to a method of forming a resistive random access memory (RRAM) device. The method includes forming a lower electrode structure over a conductive interconnect layer disposed over a substrate; forming a doped data storage element having a plurality of data storage layers over the lower electrode structure, the plurality of data storage layers are formed to have different concentrations of a dopant; and forming an upper electrode structure over the doped data storage element. In some embodiments, the dopant is configured to form bonds with oxygen at a bond energy of greater than approximately 500 kJ/mol. In some embodiments, the doped data storage element has a thickness; and the dopant has a peak dopant concentration that is separated from the lower electrode structure by a distance that is in a range of between approximately 5% and approximately 40% of the thickness. In some embodiments, the doped data storage element has a doping profile with a non-zero doping concentration that continuously extends from a bottom surface of the doped data storage element to a top surface of the doped data storage element. In some embodiments, the doped data storage element has a doping profile with a substantially zero doping concentration that continuously extends from a top surface of the doped data storage element to a position that is separated from a bottom surface of the doped data storage element by a non-zero distance. In some embodiments, the doped data storage element has a doping profile that is asymmetric along a thickness of the doped data storage element.

In yet other embodiments, the present disclosure relates to a resistive random access memory (RRAM) device. The RRAM device includes a first electrode over a conductive lower interconnect layer; a second electrode over the first electrode; and a doped data storage structure disposed between the first electrode and the second electrode and having a variable resistance, the doped data storage structure having a dopant with a doping concentration having a non-uniform doping profile along a height of the doped data storage structure. In some embodiments, the dopant comprises nitrogen, fluorine, carbon, or phosphorous. In some embodiments, the dopant has a peak dopant concentration that is separated from the first electrode by a distance that is in a range of between approximately 5% and approximately 40% of the height of the doped data storage structure. In some embodiments, the doped data storage structure has a peak dopant concentration that is between approximately 1% and approximately 10%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first electrode disposed over a substrate;
   a second electrode over the first electrode;
   a doped data storage structure disposed between the first electrode and the second electrode, wherein the doped data storage structure has a dopant with a doping concentration profile that is asymmetric over a height of the doped data storage structure and that has a maximum dopant concentration at non-zero distances from a top surface and a bottom surface of the doped data storage structure; and
   wherein the doping concentration profile comprises a first region having a first doping concentration that increases over a first non-zero height, a second region having a second doping concentration that decreases over a second non-zero height, and a third region having a third doping concentration that is substantially constant over a third non-zero height, the maximum dopant concentration being disposed between the first region and the second region.

2. The device of claim 1, wherein the doped data storage structure has a doping profile with a substantially zero doping concentration along the top surface of the doped data storage structure.

3. The device of claim 1, wherein the doping concentration profile has a skew normal distribution that is vertically offset from a center of the doped data storage structure.

4. The device of claim 1, wherein the maximum dopant concentration is a molar percentage of the dopant that is in a range of between approximately 1% and approximately 20%.

5. The device of claim 1, wherein the dopant comprises fluorine, phosphorous, or carbon.

6. The device of claim 1, wherein the third doping concentration is a substantially zero doping concentration.

7. The device of claim 1, wherein the third region is separated from the first region by the second region.

8. The device of claim 1, wherein the doping concentration profile has an arched shape.

9. A device, comprising:
   a lower electrode structure over a substrate;
   a doped data storage structure over the lower electrode structure, wherein the doped data storage structure has a doping concentration profile that is asymmetric over a height of the doped data storage structure and that continually increases from a lower surface of the doped data storage structure facing the lower electrode structure to a peak dopant concentration at a distance over the lower surface, the distance being between approximately 5% and approximately 40% of a thickness of the doped data storage structure; and an upper electrode structure over the doped data storage structure.

10. The device of claim 9, wherein the peak dopant concentration is a molar percentage of a dopant that is in a range of between approximately 1% and approximately 10%.

11. The device of claim 9, wherein the doping concentration profile has a non-zero doping concentration continuously extending from a top surface of the doped data storage structure to a bottom surface of the doped data storage structure.

12. The device of claim 9, wherein the doping concentration profile continually increases from an upper surface of the doped data storage structure to the peak dopant concentration.

13. The device of claim 9, wherein the doping concentration profile comprises a first region having a variable doping concentration over a first non-zero height and a second region having a second doping concentration that is substantially constant over a second non-zero height, the peak dopant concentration being disposed within the first region.

14. The device of claim 9, wherein the doping concentration profile within the doped data storage structure has a same non-zero doping concentration both vertically above and vertically below the peak dopant concentration shape.

15. A method of forming a device, comprising:
forming a lower electrode structure over a substrate;
forming a doped data storage structure over the lower electrode structure, wherein the doped data storage structure has a doped region with an asymmetric doping concentration profile that comprises a maximum dopant concentration at a depth of between approximately 5% and 40% of a thickness of the doped data storage structure;
forming an upper electrode structure over the doped data storage structure; and
wherein the asymmetric doping concentration profile continually decreases from the maximum dopant concentration towards both the lower electrode structure and the upper electrode structure.

16. The method of claim 15, wherein the doped data storage structure is formed by way of a multi-step deposition process that forms a plurality of data storage layers respectively having different concentrations of a dopant.

17. The method of claim 15, wherein the asymmetric doping concentration profile has an arched shape.

18. The method of claim 15, wherein the maximum dopant concentration is a molar percentage of a dopant that is in a range of between approximately 1% and approximately 20%.

19. The method of claim 15, wherein the asymmetric doping concentration profile comprises a first region having a variable doping concentration over a first non-zero height and a second region having a second doping concentration that is substantially constant over a second non-zero height, the maximum dopant concentration being disposed within the first region.

20. The method of claim 15, wherein the asymmetric doping concentration profile within the doped data storage structure has a first doping concentration vertically between the maximum dopant concentration and the lower electrode structure and a second doping concentration vertically between the maximum dopant concentration and the upper electrode structure, the first doping concentration being equal to the second doping concentration.

* * * * *